(12) United States Patent
Takatsu

(10) Patent No.: US 7,421,017 B2
(45) Date of Patent: Sep. 2, 2008

(54) DIGITAL FILTER ADAPTIVELY LEARNING FILTER COEFFICIENT

(75) Inventor: Motomu Takatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 646 days.

(21) Appl. No.: 10/639,616

(22) Filed: Aug. 12, 2003

(65) Prior Publication Data

US 2004/0071206 A1    Apr. 15, 2004

(30) Foreign Application Priority Data

Aug. 13, 2002 (JP) .............................. 2002-235975

(51) Int. Cl.
*H03K 5/159* (2006.01)
*H04B 1/10* (2006.01)
(52) U.S. Cl. ..................... 375/232; 375/233; 375/350
(58) Field of Classification Search ................ 381/318, 381/71.8, 94.1, 59, 71.4; 375/232, 233, 348, 375/350
See application file for complete search history.

(56) References Cited

U.S. PATENT DOCUMENTS

| 4,905,254 | A | * | 2/1990 | Bergmans | 375/233 |
| 5,488,667 | A | * | 1/1996 | Tamamura et al. | 381/71.4 |
| 5,703,903 | A | * | 12/1997 | Blanchard et al. | 375/232 |
| 5,748,752 | A | * | 5/1998 | Reames | 381/94.1 |
| 6,289,063 | B1 | * | 9/2001 | Duxbury | 375/348 |
| 6,418,228 | B1 | * | 7/2002 | Terai et al. | 381/71.8 |
| 6,608,904 | B1 | * | 8/2003 | Feltstrom | 381/59 |
| 6,876,751 | B1 | * | 4/2005 | Gao et al. | 381/318 |
| 2003/0053647 | A1 | * | 3/2003 | Kates | 381/318 |
| 2003/0235245 | A1 | * | 12/2003 | Erdogan et al. | 375/232 |

FOREIGN PATENT DOCUMENTS

| JP | 5-281981 | 10/1993 |
| JP | 6-110470 | 4/1994 |
| JP | 6-110471 | 4/1994 |
| JP | 6-266370 | 9/1994 |
| JP | 6-318845 | 11/1994 |
| JP | 6-332477 | 12/1994 |
| JP | 7-64572 | 3/1995 |
| JP | 7-160508 | 6/1995 |
| JP | 7-191682 | 7/1995 |
| JP | 8-69289 | 3/1996 |
| JP | 8-123436 | 5/1996 |
| JP | 8-123437 | 5/1996 |
| JP | 8-270273 | 10/1996 |
| JP | 9-171388 | 6/1997 |
| JP | 9-171389 | 6/1997 |
| JP | 10-11074 | 1/1998 |
| JP | 10-11075 | 1/1998 |
| JP | 10-322167 | 12/1998 |
| JP | 11-133981 | 5/1999 |
| JP | 11-300275 | 11/1999 |
| JP | 2001-255877 | 9/2001 |

* cited by examiner

*Primary Examiner*—Don N Vo
(74) *Attorney, Agent, or Firm*—Greer, Burns & Crain, Ltd.

(57) ABSTRACT

A linear filter feeds back an error signal generated using the output of an adaptive filter to a learning circuit. The learning circuit learns the coefficients of the adaptive filter using the error signal. The coefficients of the linear filter are determined depending on the generation method of a target signal for error minimization. In a signal interpolation type timing recovery digital filter, the coefficients of an inverse interpolation filter are determined in such a way as to minimize an error of a signal after interpolation.

30 Claims, 18 Drawing Sheets

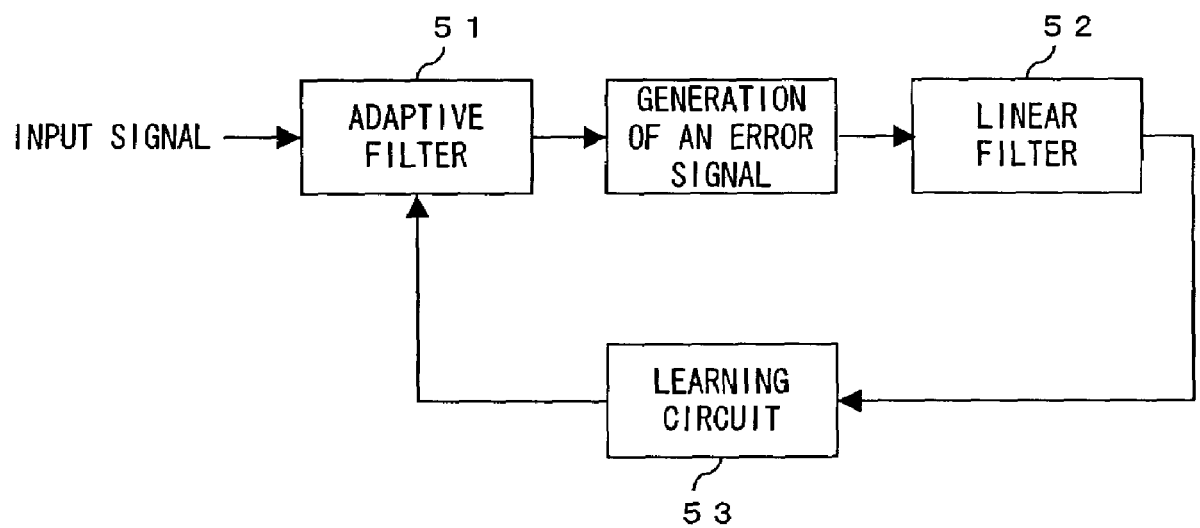
F I G. 2

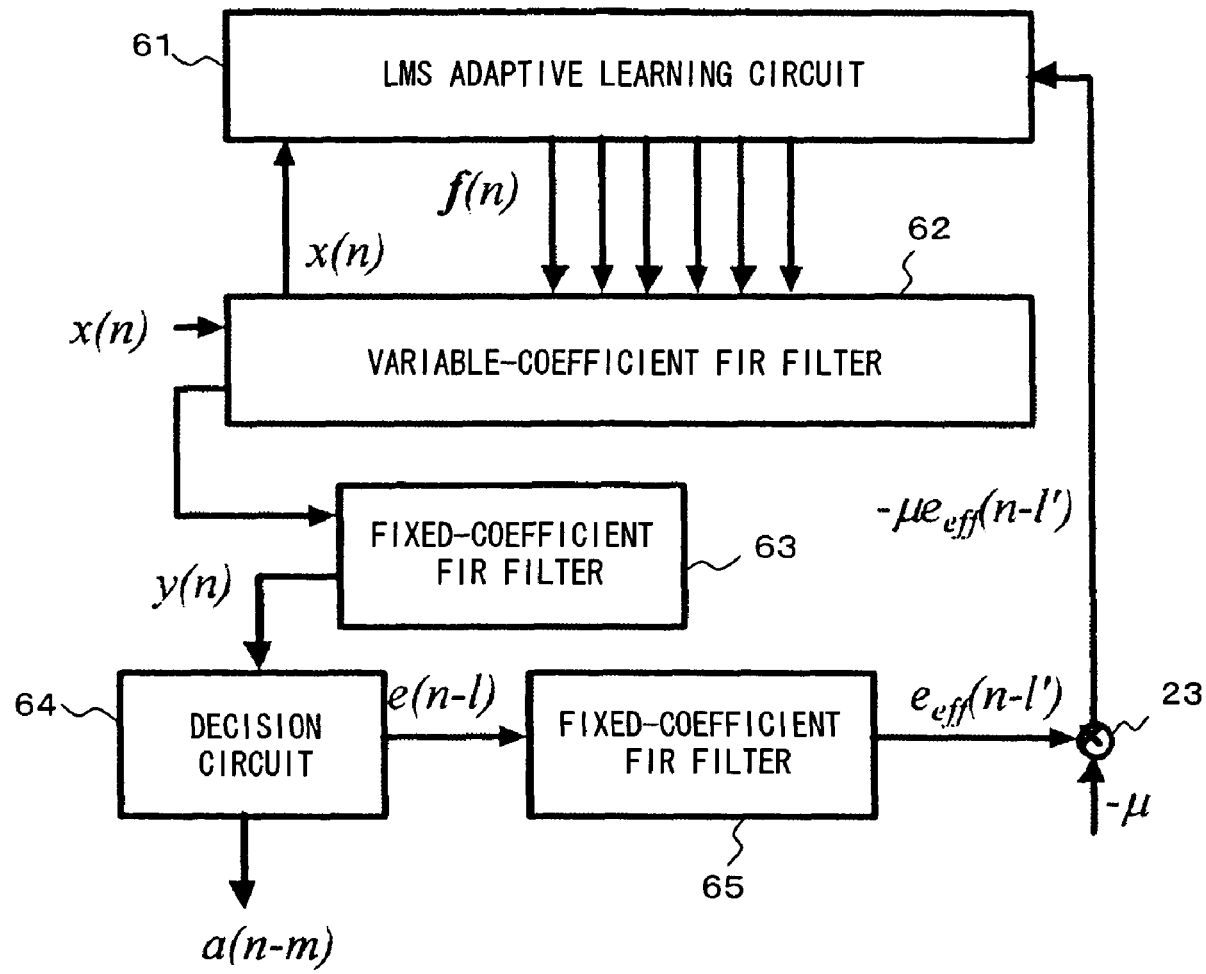
F I G. 3 A

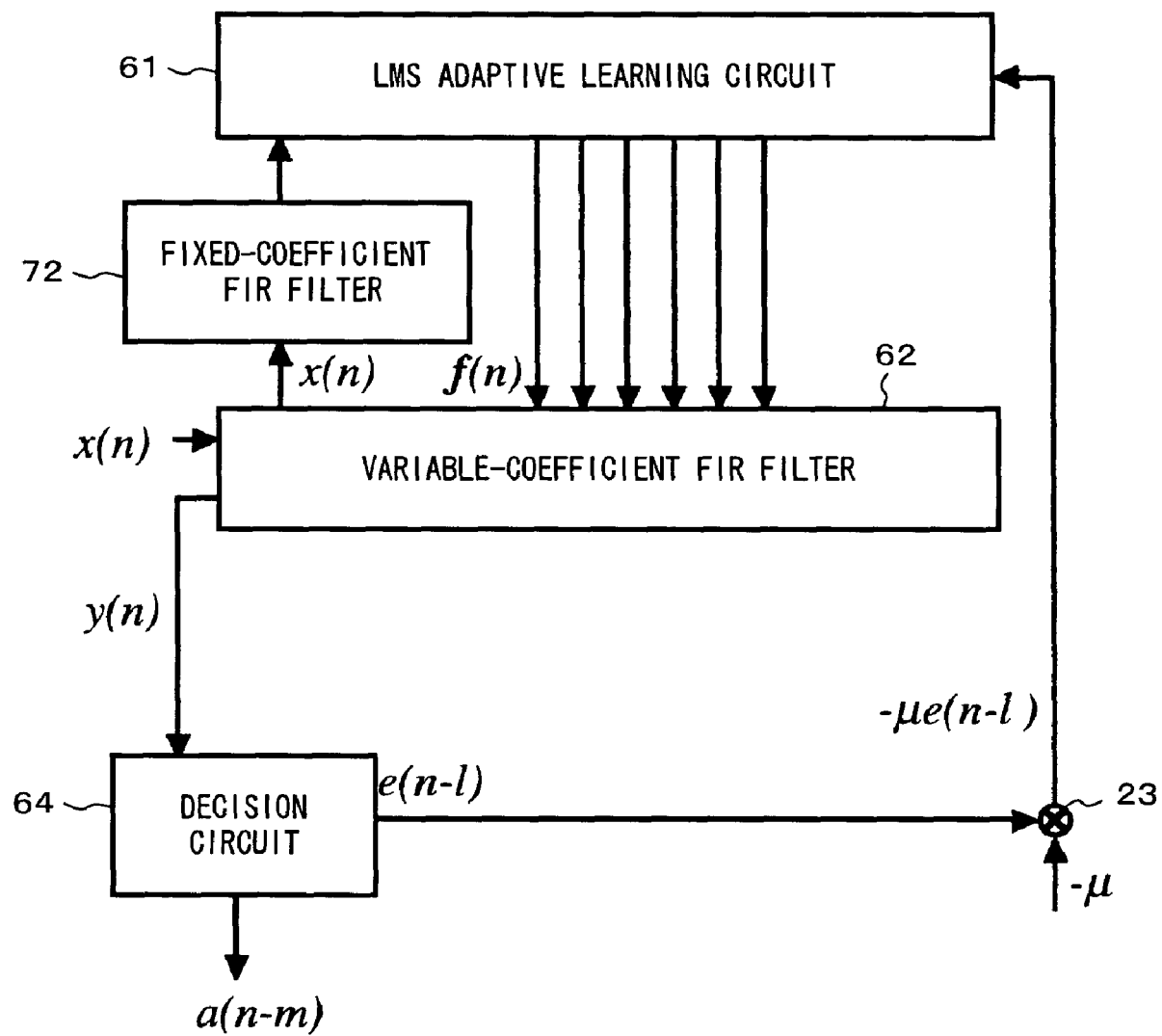
F I G. 5

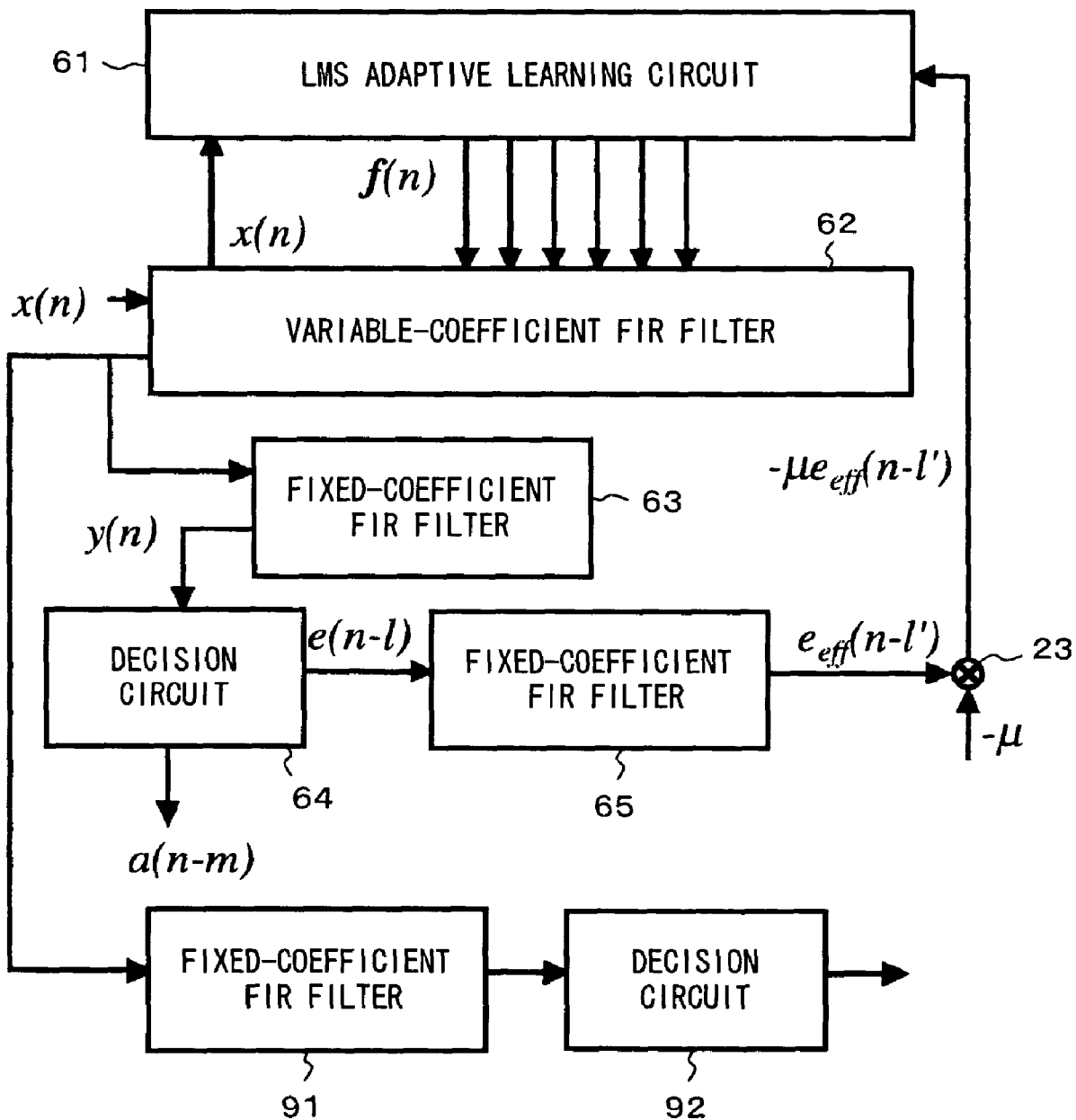
F I G. 9

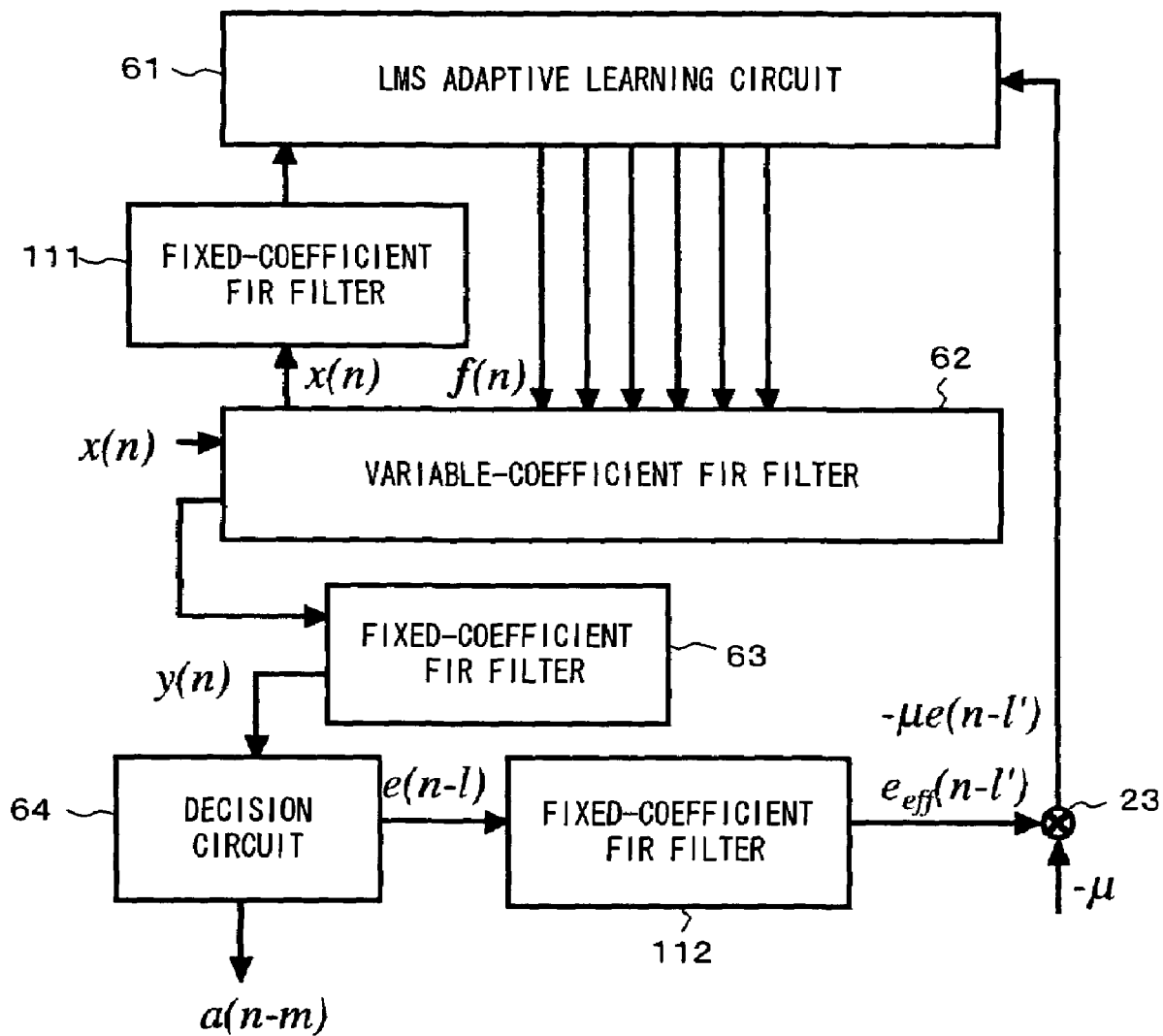
F I G. 14

DIGITAL FILTER ADAPTIVELY LEARNING FILTER COEFFICIENT

BACKGROUND OF THE INVENTION

1. Field of the Invention

The present invention relates to a learning algorithm for the optimization and adaptive equalization of the filter coefficients (tap coefficients) of a digital filter. In particular, it relates to a learning algorithm for the optimization and adaptive equalization of filter coefficients in the partial response (PR) equalization used in the read channel circuit of a disk device and the like. It also relates to a learning algorithm for the optimization and adaptive equalization of filter coefficients used when a signal interpolation type timing recovery method is adopted.

2. Description of the Related Art

In the read channel circuit of a magnetic disk or an optical disk, the analog data signal read from a recording media by a head is amplified to an appropriate amplitude by a head amplifier, an automatic gain controller (AGC) and an analog filter. In this case, anti-aliasing, the elimination of high-frequency-band noise and a part of waveform equalization are conducted against an analog signal. Then, the analog signal is converted into a digital signal by the discretization/quantization of an analog/digital converter (ADC) and the waveform is shaped by an equalization filter. Then, it is outputted.

In a partial response maximum likelihood (PRML) method, which is currently used mainly as the reproduction method of recorded data and a method of iterative decoding, whose further development is expected in the future, equalization output is outputted as a PR signal, including a finite length of inter-symbol interference. If there is no error in the signal, the obtained PR signal is indicated by the transition among finite states. An input signal series, in which the error of an equalized signal is minimized (in which, as a result, the error rate of an equalized signal is minimized) can be calculated by the maximum likelihood decision by a Viterbi decoder or an iterative decoding method using a maximum a posteriori probability (MAP) decider, and the original signal series can be estimated.

Although an equalization filter is used to obtain this PR equalization signal, the filter coefficients must be adaptively changed using an appropriate learning algorithm instead of fixing them in order to absorb the fluctuations of a characteristic due to variations in a recording medium and a head, its time fluctuations, and a recording place (cylinder). As this learning algorithm, the least mean square (LMS) algorithm is usually used. The LMS algorithm is as follows.

If a signal to be inputted to an equalization filter at the m-th clock time and the i-th filter coefficient are $x(m)$ and $f(i)$, respectively, the output signal $y(m)$ of the equalization filter is expressed as follows:

$$y(m) = \sum_{i=N_1}^{N_2} f(i) \times (m-i) = \sum_{i=N_1}^{N_2} f(i) \sum_{k=-\infty}^{\infty} h(k)a(m-i-k) \quad (1)$$

If the expected squared value of an error signal $e(m)$, which is the difference between an ideal output $\hat{y}(m)$ (hereinafter described as "y(m) hat") and a real output $y(m)$ ($e(m)=y(m)-y(m)$ hat), is mse, the slope of mse against $f(i)$ is expressed as follows:

$$\frac{\partial}{\partial f(i)} mse = \frac{\partial}{\partial f(i)} \langle e(m)^2 \rangle \quad (2)$$
$$= 2\left\langle e(m) \frac{\partial}{\partial f(i)} y(m) \right\rangle$$
$$= 2\langle e(m) \times (m-i) \rangle$$

Therefore, it is found that this slope is the expected product of error signal $e(m)$ and the input signal $x(m-i)$ of the i-th tap.

An LSM algorithm is an adaptive algorithm used to obtain a filter coefficient that minimizes an expected squared error by estimating the slope vector for a filter coefficient with a squared error using an instantaneous value $e(m) \times (m-i)$ at each clock time instead of an expected value $<e(m) \times (m-i)>$, multiplying the value by an appropriate coefficient and feeding it back.

FIG. 1A shows the basic circuit of an adaptive linear equalizer using an LMS algorithm. FIG. 1A shows the equalizer with six taps. The equalizer shown in FIG. 1A comprises an LMS adaptive learning circuit 11, a variable-coefficient finite impulse response (FIR) filter and a decision circuit 13. Each of the learning circuit 11 and FIR filter 12 further comprises a delay device 21, an adder 22 and a multiplier 23. The delay device 21 delays an input signal by a delay D of a bit cycle and outputs it. The adder 22 outputs the sum of two inputted signals. The multiplier 23 outputs the product of two inputted signals.

The learning circuit 11 generates the i-th filter coefficient $f_i(n)$ (i=0, 1, 2, 3, 4 and 5) at the n-th clock time, based on a signal fed back from the decision circuit 13 and outputs it to the FIR filter 12. The decision circuit 13 generates an error signal $e(n)$ and a decision signal $a(n)$ from a PR signal $y(n)$ received from the FIR filter 12. $e(n)$ is multiplied by a coefficient $-m$, and $-me(n)$ is fed back to the learning circuit 11.

FIG. 1B shows the real equalization circuit that is configured based on the basic configuration shown in FIG. 1A. FIG. 1C shows the configuration of the equalization circuit, which is shown in FIG. 1B.

In the equalization circuit shown in FIG. 1B, latency for decision and error calculation are taken into consideration, and the FIR filter 12 is also configured so as to be suited for a high speed operation. In this circuit it is assumed that the decision circuit 13 delays/outputs an error signal $e(n-1)$ by a delay $D^l$ (l=1, 2, 3, . . . ) of l stages, and a decision signal a (n−m) by a delay $D^m$ (m=1, 2, 3, . . . ) of m stages. For this purpose, $-me(n-l)$ is fed back to the learning circuit 11, and the learning circuit 11 is provided with a delay device 24 delaying an input signal $x(n)$ by $D^l$.

Next, timing recovery is described. If sampling timing, by which consecutive signals are made discrete, does not match, a correct output cannot be obtained. Therefore, a sampling phase error is detected from the equalization output of a circuit and an ideal equalization signal based on the result of decision, and the sampling timing of the ADC is adjusted by the loop control of a phase-locked loop (PLL) or a delay-locked loop (DLL).

In this case, since in the iterative decoding method using the maximum likelihood decision or a MAP decider, a rather large amount of time lag is needed to make the decision, sometimes another simple PR signal different from the PR signal $y(n)$ used in the decision circuit 13 is also used to calculate an error signal used to adjust the timing. In this case, these two PR signals are not generated separately. Usually, firstly, a lower-order PR signal for timing adjustment is generated by an adaptive filter, and then, by passing it through a fixed-coefficient filter, a PR signal used in the decision circuit 13 is obtained.

For example, in a modified extended extended partial response (MEEPR) method, PR equalization is conducted in such a way that an ideal response against a single pulse is $(1-D^2)(1+aD+bD^2)$. In this case, firstly, a signal with a PR4 (partial response class 4) characteristic $(1-D^2)$ can be obtained by adaptive equalization, and then a characteristic needed for decision can be obtained using a three-tap fixed-coefficient FIR filter having a characteristic $(1+aD+bD^2)$. For timing recovery, a phase error signal is generated by simply judging the PR4 output.

As another timing recovery method, there is a signal interpolation type timing recovery method. In this method, instead of adjusting the sampling timing, the estimated value of an input signal in arbitrary timing can be obtained by interpolating signals sampled at predetermined intervals. The same effect as that obtained by adjusting sampling timing can be obtained by using this method.

This timing recovery method has the following advantages compared with the method of adjusting sampling timing.
(1) Since an adaptive equalization filter can be located before a timing recovery loop, there is only a small amount of loop delay.
(2) Since the entire timing recovery is digitally conducted, stable and high-speed control can be easily realized.
(3) If sampled data is stored, a retrial can be made at a high speed when interpolating it again.
(4) Since there is not always a need to interpolate a plurality of segments of stored data in sequential order, timing recovery different from that of the method of adjusting sampling timing is possible.

However, if the adaptive equalization filter is located out of a loop, the clock time of a signal handled by an adaptive equalization is different from that of a signal corresponding to the interpolation output after timing recovery. Therefore, an output error cannot be simply fed back. For this reason, its feedback is usually made after an output error signal is converted into the value at the clock time of the input signal by inverse interpolation. For this inverse interpolation, zero-th order hold or linear interpolation is usually used. In the signal interpolation type timing recovery method, sampling is usually conducted at a rate higher than the symbol rate of a signal in order to improve interpolation accuracy.

FIG. 1D shows the configuration of a read channel circuit adopting the signal interpolation type timing recovery method. The read channel circuit shown in FIG. 1D comprises an AGC/analog amplifier 31, an A/D converter 32, an equalization filter 33, an interpolator 34, a decider 35, a phase error detector 36, a loop filter 37, coefficient generators 38 and 39, an equalization error detector 40, an inverse interpolator 41, an LMS adaptive learning circuit 42 and a gain error detector 43. Of these devices, the equalization filter 33 and the learning circuit 42 correspond to the FIR filter 12 and the learning circuit 11, respectively, which are shown in FIG. 1C. The decider 35 and the equalization error detector 40 correspond to the decision circuit 13 shown in FIG. 1C.

The AGC/analog amplifier 31 amplifies analog signals from a head, and the A/D converter 32 converts analog signals into digital signals by sampling. The equalization filter 33 shapes the waveform of a digital signal using filter coefficients outputted from the LMS adaptive learning circuit 42, and the interpolator 34 generates a signal in a necessary timing by interpolating the output signal of the equalization filter 33. The decider 35 estimates the original signal series and outputs a decision signal.

The phase error detector 36 detects a sampling phase error using the output of the decider 35, and the loop filter 37 generates phase information for interpolation from the phase error. The coefficient generators 38 and 39 generate interpolation coefficients and inverse interpolation coefficients, respectively using the output of the loop filter 37, and output the coefficients to the interpolator 34 and the inverse interpolator 41, respectively.

The equalization error detector 40 detects an equalization error using the output of the decider 35 and outputs an error signal. The inverse interpolator 41 inversely interpolates the error signal from the equalization error detector 40 and generates an error signal in the original timing. The LMS adaptive learning circuit 42 generates filter coefficients by an LMS algorithm using the error signal from the inverse interpolator 41, and outputs it to the equalization filter 33.

The gain error detector 43 detects a gain error using the output of the decider 35, and the AGC/analog amplifier 31 changes a gain based on the gain error.

By interpolating sampled signals, the original signal series can be correctly estimated and by inversely interpolating the error signal and feeding it back, filter coefficients suited for a signal handled by the equalization filter 33 can be generated.

There are learning algorithms for an adaptive filter other than LMS. For example, as a method for minimizing an error of the linear operation result for an output of an adaptive equalizer instead of an error of its output, there is a filtered X LMS algorithm used to eliminate noise and the like. In this algorithm, the correlation between a result obtained by passing an input signal through a filter that approximates a transfer function from speaker output that is proportional to the output of an adaptive equalization, up to a measurement point, and an error signal, is used as a signal for filter coefficient update. Thus, filter coefficients that can minimize the power of an error (residual noise) at the measurement point can be obtained.

The learning algorithm for the optimization and adaptive equalization of filter coefficients in the conventional linear equalizer described above has the following problems.

In the conventional PR equalization circuit, including an adaptive filter, in which filter coefficients change adaptively, an LMS algorithm is used as the learning algorithm of filter coefficients. This algorithm estimates the slope of a squared error against a filter coefficient and uses the estimated slope in order to correct the filter coefficient. In this case, the expected squared error value can be converged into the minimum value in a small amount of calculation, which is an advantage.

However, in a real system, sometimes filter coefficients that minimize the output error of an adaptive filter does not always realize a filter having the best characteristic. The following are some example cases.

In the first case, an equalization filter is configured by serially connecting two linear filters; an adaptive filter and a fixed-coefficient filter. In this case, the expected squared error value of the fixed-coefficient filter, which is its final output, should be minimized, instead of that of the output of the adaptive filter, which is its intermediate output. For example, this corresponds to the case where an MEEPR method is organized in such a way that firstly a PR4 characteristic $(1-D^2)$ for timing recovery is obtained using the adaptive filter and then an MEEPR characteristic $(1-D^2)(1+aD+bD^2)$ is obtained using a fixed-coefficient FIR filter $(1+aD+bD^2)$ serially connected to the adaptive filter.

In the second case, a signal interpolation type timing recovery equalizer is used. In this case, since, as shown in FIG. 1D, in a usual configuration, where an interpolator interpolating signals is connected after an adaptive filter, the output of the adaptive filter is an intermediate output. Therefore, in this case, the expected squared error value of the output of the interpolator, which is the final output, should be minimized. If an interpolator is regarded as a time-variant linear filter, the second case can be considered to be the modification of the first case. However, since the sampling interval of an input to an adaptive filter is generally different from the sampling interval of an output from the interpolator, feedback is needed between different clock domains.

In the third case, instead of estimating an input signal series by checking the output level of an equalizer, decision is conducted by an iterative decoding method using the maximum likelihood decision or a MAP decider. In this case, instead of decision with the output of an adaptive filter is conducted, an appropriate calculation is conducted using the output and then the decision is conducted. Therefore, filter coefficients that minimize the error rate of the decision does not always minimize the error of the output of the adaptive filter.

These situations often occur in a real system. None of these situations always occurs independently, and there are a variety of combinations.

In particular, decision by the maximum likelihood decision or a MAP decider in the third case is an indispensable technology in the current read channel circuit. However, since currently an LMS algorithm suitable for level decision is used as the learning algorithm of an adaptive equalizer, optimal filter coefficients cannot be obtained. In order to cope with this situation, coefficient learning can be conducted using a signal in a Viterbi decoder that conducts the maximum likelihood decision. However, such learning takes a very long time, which is another problem.

SUMMARY OF THE INVENTION

It is an object of the present invention to provide a digital filter in which optimal filter coefficients can be obtained in the above described cases and to realize an adaptive learning algorithm, which converges filter coefficients into such optimal values.

The first digital filter of the present invention comprises an adaptive filter, a time-invariant linear filter and a learning circuit. The adaptive filter has coefficients that can be adaptively changed, and the linear filter generates an error signal to be fed back, from an error signal generated using the output of the adaptive filter. The learning circuit adaptively learns the coefficients of the adaptive filter using the error signal fed back from the linear filter.

The second digital filter of the present invention comprises an adaptive filter, an interpolation filter, an inverse interpolation filter and a learning circuit. The adaptive filter has coefficients that can be adaptively changed, and the interpolation filter interpolates the output signal of the adaptive filter and generates a signal in prescribed timing. The inverse interpolation filter has filer coefficients obtained by inverting the order of the interpolation coefficients or their approximate values of the interpolation filter and generates an error signal in timing before interpolation by inversely interpolating the error signal of the output of the interpolation filter. The learning circuit adaptively learns the coefficients of the adaptive filter using the error signal fed back from the inverse interpolation filter.

BRIEF DESCRIPTION OF THE DRAWINGS

FIG. 2 shows the basic configuration of the digital filter of the present invention;

FIG. 3A shows the configuration of a first linear equalizer;

FIG. 5 shows the configuration of a fourth linear equalizer;

FIG. 9 shows the configuration of an eighth linear equalizer;

FIG. 14 shows the configuration of a tenth linear equalizer.

DESCRIPTION OF THE PREFERRED EMBODIMENTS

Figure 1:
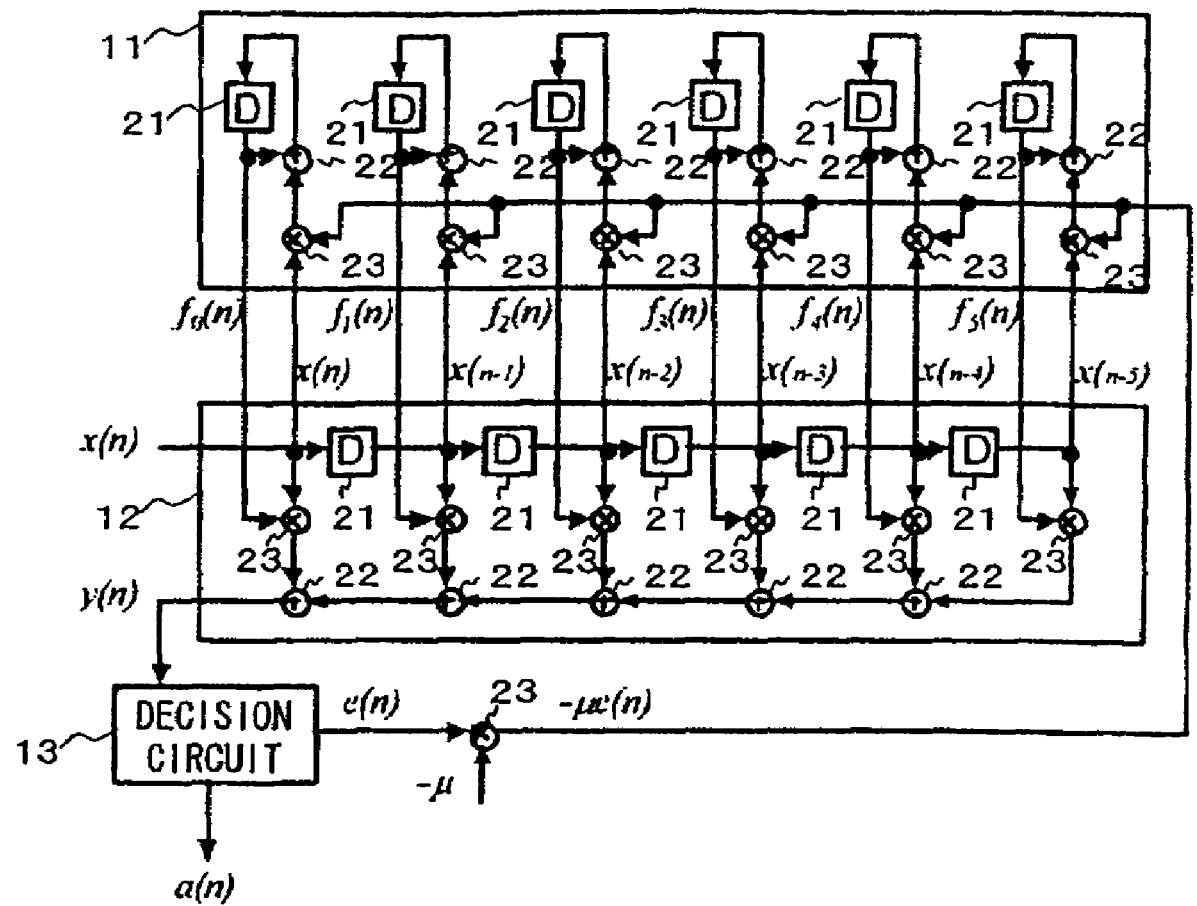
FIG. 1A shows the basic circuit of the conventional linear equalizer.
FIG. 1B shows the real circuit of the conventional linear equalizer.
FIG. 1C shows the configuration of the conventional linear equalizer.
FIG. 1D shows the configuration of a read channel circuit.
Figure 1B:
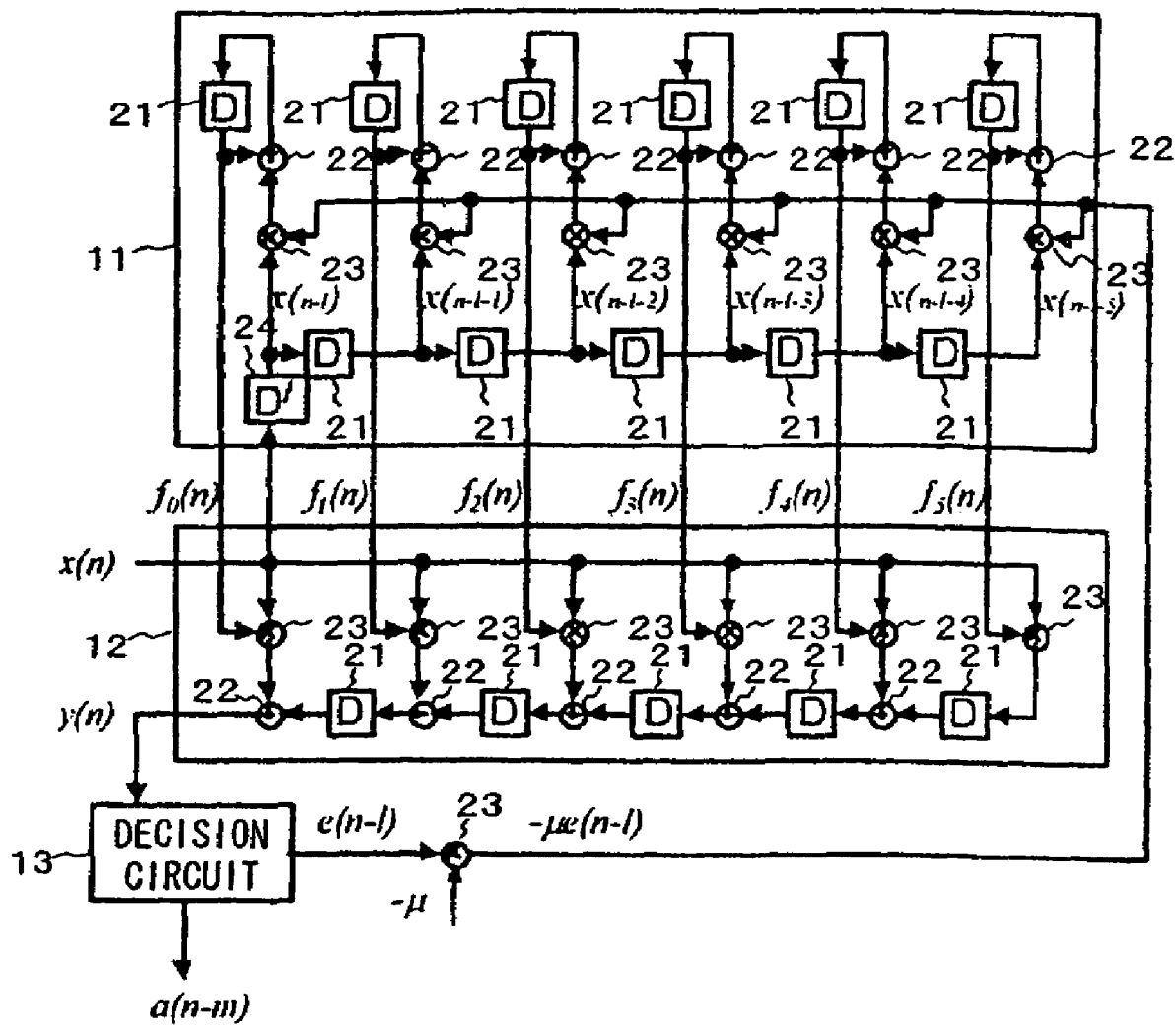
Figure 1:
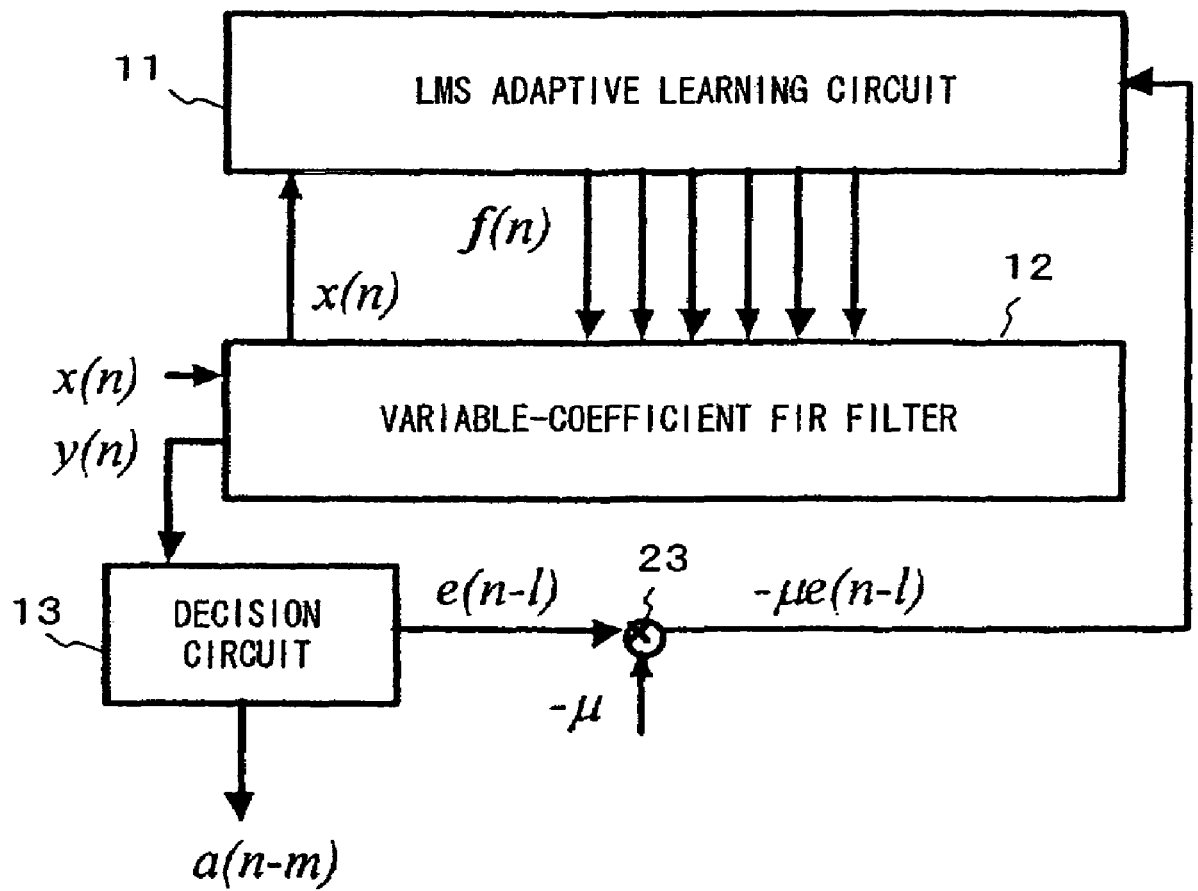

The preferred embodiments of the present invention are described in detail below with reference to the drawings.

In the first through third cases described above, it is considered to be preferable to minimize the expected squared error value of a signal obtained by passing the output signal of an adaptive filter through an appropriate linear filter or applying an appropriate linear operation to it. Furthermore, the present invention can also handle the combination of two or more cases by uniformly handling these cases with a wider concept and simultaneously can provide an adaptive learning algorithm for other optimization problems, which can be similarly formulated.

FIG. 2 shows the basic configuration of the digital filter of the present invention in the first and third cases. The digital filter shown in FIG. 2 comprises an adaptive filter 51, a time-invariant linear filter 52 and a learning circuit 53.

The adaptive filter 51 has coefficients that can be adaptively changed, and the linear filter 52 generates an error signal to be fed back from an error signal generated using the output of the adaptive filter. The learning circuit 53 adaptively learns the coefficients of the adaptive filter 51 using the error signal fed back from the linear filter 52.

In the first case, another time-invariant linear filter is connected after the adaptive filter 51, and the error signal of the output of the linear filter is inputted to the linear filter 52. In this case, a feedback signal that minimizes the expected squared error value of the output of the post linear filter connected after the adaptive filter 51 can be obtained by determining the characteristic of the linear filter 52 taking into consideration the characteristic of the post linear filter.

In the third case, if the change in the squared error of the output of the adaptive filter 51 that is caused when there is a decision error in a decision circuit that conducts the maximum likelihood decision or the maximum a posteriori probability decision, is taken into consideration, it is required that an appropriate linear operation is conducted using the output signal of the adaptive filter 51 and the error signal of the obtained signal is inputted to the linear filter 52. By determining the characteristic of the linear filter 52 in this way, a feedback signal that can minimize the expected squared error value of a signal obtained by the linear operation can be obtained.

In this case, the adaptive filter 51, for example, corresponds to a variable-coefficient FIR filter 62, which is described later. The linear filter 52, for example, corresponds to fixed-coefficient FIR filters 65, 71 and 112, which are described later. The learning circuit 53 corresponds to, for example, an LMS adaptive learning circuit 61, which is described later.

In the second case, the digital filter of the present invention comprises an adaptive filter, an interpolation filter, an inverse interpolation filter and a learning circuit.

The adaptive filter has coefficients that can be adaptively changed, and the interpolation filter interpolates the output signal of the adaptive filter and generates a signal in prescribed timing. The inverse interpolation filter has filer coefficients obtained by inverting the order of the interpolation coefficients or their approximate values of the interpolation filter and generates an error signal in timing before interpolation by inversely interpolating the error signal of the output of the interpolation filter. The learning circuit adaptively learns the coefficients of the adaptive filter using the error signal fed back from the inverse interpolation filter.

In this case, a feedback signal that minimizes the expected squared error value of the output of the interpolation filter can be obtained by regarding the interpolation filter and the inverse interpolation filter as time-variant linear filters and generating the filter coefficients of the inverse interpolation filter by inverting the order of interpolation coefficients or their approximate values used in the interpolation filter.

In this preferred embodiment, in an adaptive signal process in which an adaptive filter that can adaptively change its coefficients, compensates for a channel characteristic and obtains a desirable output signal, a signal for the coefficient learning of the adaptive filter can be obtained by feeding back an error signal obtained as the difference between the output signal of the adaptive filter and its preferable output signal after passing the error signal through an appropriate linear filter instead of simply feeding it back.

More specifically, in order to minimize an expected squared error value of a result obtained by passing a signal through a second time-variant or time-invariant linear filter after a first linear filter for coefficient learning, a third linear filter obtained by inverting the tap coefficients of the second linear filter is provided in a feedback circuit for the coefficient learning. Then, by feeding back the output error of the second linear filter through the third linear filter and multiplying it by an input signal series, a slope vector for the adaptive learning of the tap coefficients is calculated. In this case, if the second linear filter is time-variant, the third linear filter is also time-variant.

If an error of a result obtained by performing an operation corresponding to that of the second linear filter is minimized even though there is in reality no circuit corresponding to the second linear filter, the second and third linear filters are needed for the feedback. In this case, the error can be calculated using the output of the first linear filter and can be fed back using a fourth linear filter corresponding to the series of the second and third linear filters. The tap coefficients of the fourth linear filter is the self correlation function of an output signal series for an error pattern series, which is described later.

Firstly, a linear equalizer, that is configured in many stages by inserting a time-invariant linear filter after an adaptive filter, and its adaptive learning algorithm are described with reference to FIGS. 3A and 3B. In this case, a signal for the coefficient learning of an adaptive filter can be obtained by feeding back an error signal obtained as the difference between the output signal of a post linear filter and its preferable output signal through another linear filter instead of simply feeding it back.

In this example, a learning algorithm for a filter circuit that is configured by a series of a variable-coefficient adaptive FIR filter and a fixed-coefficient FIR filter is studied based on a usual LMS algorithm.

Even if a fixed-coefficient filter is connected before a variable-coefficient FIR filter, the preceding filter does not affect a coefficient learning algorithm and can be neglected since it is located outside the feedback loop of the coefficient learning algorithm.

A problem arises in the case where a fixed-coefficient filter is connected after the variable-coefficient FIR filter. In this case, if coefficient learning by a usual LMS algorithm is conducted by the variable-coefficient adaptive FIR filter alone, an obtained filter characteristic minimizes the expected squared error value of the output of the adaptive FIR filter and does not minimize the expected squared error value of the output of the entire filter circuit (that is, that of the fixed-coefficient filter). Therefore, a modification of an LMS algorithm is needed to obtain the minimum square solution.

For that purpose, firstly, the filter coefficient dependence of an output error is calculated as in a usual LMS algorithm. If the respective i-th filter coefficients of a variable-coefficient filter and a fixed-coefficient filter are $f_a(i)$ and $f_f(i)$, respectively, their output signals $y_a(m)$ and $y_f(m)$ at the m-th clock time can be expressed as follows:

$$y_a(m) = \sum_{i=N_{a1}}^{N_{a2}} f_a(i) \times (m-1) \tag{3}$$

$$y_f(m) = \sum_{j=N_{f1}}^{N_{f2}} f_f(j) y_a(m-j) = \sum_{j=N_{f1}}^{N_{f2}} f_f(j) \sum_{i=N_{a1}}^{N_{a2}} f_a(i) \times (m-i-j) \tag{4}$$

Therefore, the slope of the expected squared value of an error signal $e(m)$ ($=y_f(m)-\hat{y}_f(m)$), which is the difference between an ideal output and a real output for the i-th filter coefficient $f(i)$ is expressed as follows:

$$\begin{aligned}
\frac{\partial}{\partial f(i)} mse &= 2\left\langle e(m) \frac{\partial}{\partial f(i)} y_f(m) \right\rangle \\
&= 2\left\langle e(m) \sum_{j=N_{f1}}^{N_{f2}} f_f(j) x(m-i-j) \right\rangle \\
&= 2\left\langle \sum_{j=N_{f1}}^{N_{f2}} f_f(j) e(m+j) x(m-i) \right\rangle \\
&= 2\langle e(m) x_{eff}(m-i) \rangle \\
&= 2\langle e_{eff}(m) x(m-i) \rangle
\end{aligned} \tag{5}$$

In the above equation, $e_{eff}(m)$ is an effective error signal, which is expressed as follows:

$$e_{\mathit{eff}}(m) = \sum_{j=N_{f1}}^{N_{f2}} f_f(j)e(m+j) = \sum_{j=-N_{f2}}^{-N_{f1}} f_f(-j)e(m-j) \quad (6)$$

It is known from equation (5) that the slope of the expected squared error value is the expected product of an effective error signal $e_{\mathit{eff}}(m)$ and the input signal $x(m-i)$ of the i-th tap. Therefore, if the slope of the expected squared error value against a filter coefficient is estimated using $e_{\mathit{eff}}(m)$ instead of $e(m)$, the estimated value is multiplied by an appropriate coefficient and the obtained product is fed back, filter coefficient that minimize the expected squared error value can be obtained as in a usual LMS algorithm.

It is also known that an effective error signal $e_{\mathit{eff}}(m)$ can be obtained by passing an error signal $e(m)$ through an FIR filter, and its filter coefficients can be obtained by timewise inverting the filter coefficients of a fixed-coefficient filter for a signal. In this case, timewise-inverted filter coefficients mean tap coefficients obtained by inverting the order of original tap coefficients where each tap coefficient is arranged in relation to the number of delay stages of a corresponding tap. However, since in a real filter, the law of causality must be met, delay must be added to an input signal in order to synchronize it with the input signal.

FIG. 3A shows the configuration of a linear equalizer that generates such an effective error signal. The linear filter shown in FIG. 3A comprises an LMS adaptive learning circuit 61, a variable-coefficient FIR filter 62, fixed-coefficient FIR filters 63 and 65, a decision circuit 64 and a multiplier 23.

The learning circuit 61 corresponds to the learning circuit 11 shown in FIG. 1C, and the FIR filter 62 is an adaptive filter corresponding to the FIR filter 12 shown in FIG. 1C. The FIR filter 63 is a fixed-coefficient filter located after the adaptive filter and outputs a signal $y(n)$ $(=y_f(n))$. The decision circuit 64 generates an error signal $e(n-l)$ and a decision signal $a(n-m)$ from $y(n)$.

The FIR filter 65 is provided after the decision circuit 64 and has coefficients obtained by timewise inverting the order of the filter coefficients of the FIR filter 63. The FIR filter 65 generates an error signal $e_{\mathit{eff}}(n-l')$ from an error signal $e(n-l)$. The multiplier 23 generates $-me_{\mathit{eff}}(n-l')$ by multiplying the error signal $e_{\mathit{eff}}(n-l')$ by a coefficient $-m$ and feeds it back to the learning circuit 61. In this case, delay occurs in the FIR filter 65 in addition to a delay $D^l$ ($l=1, 2, 3, \ldots$) of the decision circuit 64, $l<l'$.

$x_{\mathit{eff}}(m)$ in equation (5) is an effective input signal and corresponds to a filtered X in a filtered X LMS algorithm. It is expressed as follows:

$$x_{\mathit{eff}}(m) = \sum_{j=N_{f1}}^{N_{f2}} f_f(j)x(m-j) \quad (7)$$

It is known from equation (5) that the slope of an expected squared error value is the expected product of a signal $x_{\mathit{eff}}(m-i)$ obtained bypassing the input signal $x(m-i)$ of the i-th tap through a fixed-coefficient filter and an error signal $e(m)$.

Therefore, if the slope of the expected squared error value against a filter coefficient is estimated using the effective input signal $x_{\mathit{eff}}(m-i)$ instead of $x(m-i)$, the estimated value is multiplied by an appropriate coefficient and the obtained product is fed back, filter coefficients that minimize the expected squared error value can be obtained as in a usual LMS algorithm.

In this case, by feeding back an error signal obtained as the difference between the output signal of an adaptive filter and its preferable output signal without passing it through a filter, and by correlating the input signal of the adaptive filter to a signal obtained by passing it through an appropriate linear filter, a signal for the coefficient learning of an adaptive filter can be obtained. In this case, the effective input signal $x_{\mathit{eff}}(m-i)$ can be obtained by passing the input signal $x(m-i)$ through an FIR filter, and its filter coefficients are the same as the coefficients of a fixed-coefficient filter located after it.

Figure 3B:
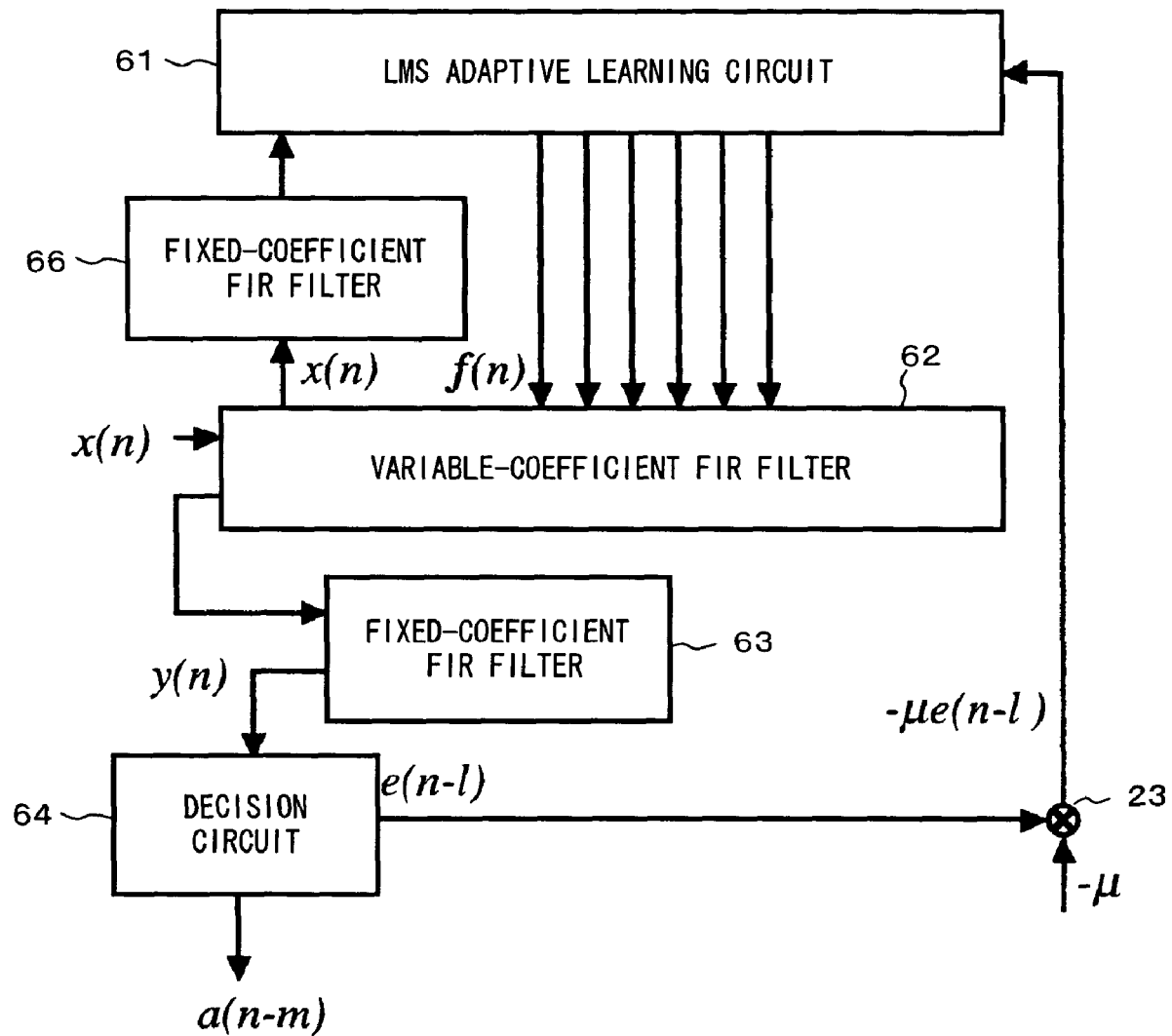
FIG. 3B shows the configuration of a second linear equalizer.

FIG. 3B shows the configuration of a linear equalizer that generates such an effective input signal. The linear equalizer shown in FIG. 3B is configured by removing the FIR filter 65 from the configuration shown in FIG. 3A and inserting the fixed-coefficient FIR filter 66 between the learning circuit 61 and the FIR filter 62.

The FIR filter 66 has the same filter coefficients as the FIR filter 63 and generates an effective input signal $x_{\mathit{eff}}(n)$ from an input signal $x(n)$. The multiplier 23 generates $-me_{\mathit{eff}}(n-l)$ by multiplying an error signal $e_{\mathit{eff}}(n-l)$ by a coefficient $-m$ and feeds it back to the learning circuit 61.

Next, the configuration of a linear equalizer that conducts the maximum likelihood decision or MAP decision of a PR equalization signal and its adaptive learning algorithm are described with reference to FIGS. 4 through 6. In this case, a decision circuit operates as a decoder restoring the original signal bit series using a Viterbi decoder, a MAP decider, or the like, instead of judging the level of a signal after equalization. Then, the linear equalizer conducts coefficient learning so that a squared error of a result obtained by applying an appropriate linear operation to the output of an adaptive filter may have the minimum expected value instead of the squared error of the output of the adaptive filter.

If the original data series is estimated from a PR-equalized signal series, an input bit series in which the probability of obtaining the same signal as an actually obtained PR signal becomes the highest is calculated by the maximum likelihood decision, the MAP decision or the like. If there is additive Gaussian noise, it can be said that the smaller the timewise sum of the squared differences between the actually obtained PR signal and a PR signal obtained from an estimated input bit series is, the more probable that it is the input bit series.

Therefore, an optimal equalization filter reduces the probability that a squared error for a correct signal bit series becomes larger than the squared error for a wrong signal bit series, at the lowest level. Therefore, the filter coefficients of an adaptive filter is determined in such a way that the expected difference between the sum of squares of the output error signal series for a correct bit series and the sum of squares of the output error signal series obtained when there is a decision error, may increase. Thus, the probability that a decoder misjudges can be reduced.

Firstly, the difference between the squared error for a correct bit series $a(m)$ ($-\infty<m<\infty$) and the squared error for a bit series $a(m)+a_{\mathit{err}}(m)$ obtained by adding an error pattern $a_{\mathit{err}}(m)$ to $a(m)$ is calculated. In this case, a filter output $y(m)$, an ideal equalization output $\hat{y}(m)$ hat and an output with a decision error $\hat{y}_{\mathit{err}}(m)$ hat are expressed as follows:

$$y(m) = f \otimes x = \sum_{j=Nf1}^{Nf2} f(j)x(m-j) \quad (8)$$

-continued $$\hat{y}(m) = g \otimes a = \sum_{i=Ng1}^{Ng2} g(i)a(m-i) \quad (9)$$

$$\hat{y}_{err}(m) = g \otimes a_{err} = \sum_{i=Ng1}^{Ng2} g(i)a_{err}(m-i) \quad (10)$$

$$= \sum_{i=Ne1}^{Ne2} g(m-i)a_{err}(i)$$

In this case, a change in a squared error due to a decision error (increase of path metric) can be expressed as follows:

$$\Delta mse = \sum_{m=-\infty}^{\infty} (\hat{y}(m) + \hat{y}_{err}(m) - y(m))^2 - \sum_{m=-\infty}^{\infty} (\hat{y}(m) - y(m))^2 \quad (11)$$

$$= \sum_{m=-\infty}^{\infty} \hat{y}_{err}(m)^2 - 2 \sum_{m=-\infty}^{\infty} \hat{y}_{err}(m)e(m)$$

The first term of equation (11) indicates that the error increases due to the decision error and corresponds to a distance between signals. The second term indicates a change in an error due to an output error (equalization error and noise after equalization) This second term indicates a factor that varies depending on bit patterns before and after the target signal and noise. Therefore, if the fluctuations of this term are large, sometimes Δmse becomes negative and there is a decision error.

This problem can be basically handled in the same way as a decision error where the first term is an interval between levels and the second term is twice the squared error (sum of an equalization error and noise after equalization) of a signal. Therefore, there is no problem if the expected squared error value is minimized by using an error signal obtained by correlating a usual error signal to the output signal series of an error pattern series instead of the usual error signal.

The operation of correlating a signal to another signal is equivalent to convolution of a signal with a signal obtained by timewise inverting the signal. Therefore, the problem is the same as a problem in which the squared error of a signal obtained by passing an error signal through a post FIR filter having coefficients obtained by timewise inverting an output signal series for an error pattern series, is minimized.

As described earlier, if there is a post FIR filter, it is known that an squared error of its output can be minimized if an error signal is fed back through an FIR filter having coefficients obtained by timewise inverting the coefficients of the post FIR filter. Thus, if an output error signal is fed back through an FIR filter whose filter coefficients are the self correlation function of an output signal series for an error pattern series, an algorithm for converging the filter coefficients into values that minimize the number of decision errors for the error pattern can be obtained.

This fact can be mathematically expressed as follows. In the following equation, m indicates a clock time at which an error pattern may occur.

$$\frac{\partial}{\partial f(i)} \left\langle \left( \sum_{k=-\infty}^{\infty} \hat{y}_{err}(k)e(m+k) \right)^2 \right\rangle = \quad (12)$$

$$\left\langle \sum_{k_2=-\infty}^{\infty} \hat{y}_{err}(k_2)e(m+k_2) \sum_{k=-\infty}^{\infty} \hat{y}_{err}(k) \frac{\partial}{\partial f(i)} e(m+k) \right\rangle =$$

$$\left\langle \sum_{k_2=-\infty}^{\infty} \sum_{k=-\infty}^{\infty} \hat{y}_{err}(k_2)\hat{y}_{err}(k)e(m+k_2)x(m+k-i) \right\rangle =$$

$$\left\langle \sum_{k_2=-\infty}^{\infty} \sum_{k=-\infty}^{\infty} \hat{y}_{err}(k_2)\hat{y}_{err}(k)e(m+k_2-k)x(m-i) \right\rangle =$$

$$\left\langle x(m-i) \sum_{k=-\infty}^{\infty} e(m-k) \sum_{k_2=-\infty}^{\infty} \hat{y}_{err}(k_2)\hat{y}_{err}(k+k_2) \right\rangle =$$

$$\left\langle x(m-i)e_{eff}(m) \right\rangle$$

$$e_{eff}(m) = \sum_{k=-\infty}^{\infty} f_f(j)e(m-k) \quad (13)$$

$$f_f(k) = \sum_{k_2=-\infty}^{\infty} \hat{y}_{err}(k_2)\hat{y}_{err}(k+k_2) \quad (14)$$

It is known from equation (12) that the slope of an expected squared error value is the expected product of an effective error signal $e_{eff}(m)$ and the input signal x(m−i) of the i-th tap. This $e_{eff}(m)$ can be obtained by passing e (m) through an FIR filter, as shown in equation (13) and its filter coefficient $f_f(k)$ is the self correlation function of an output signal series of an error pattern series, as shown in equation (14).

Therefore, in a linear equalizer conducting the maximum likelihood decision or the MAP decision, a filter having an impulse response that corresponds to the self correlation function of the output error signal of an adaptive filter in the case that a decision circuit makes a decision error for a specific pattern, is used as an FIR filter that feeds back an error signal. Thus, the error resistance of the decision circuit against the specific error pattern can be improved.

Figure 4:
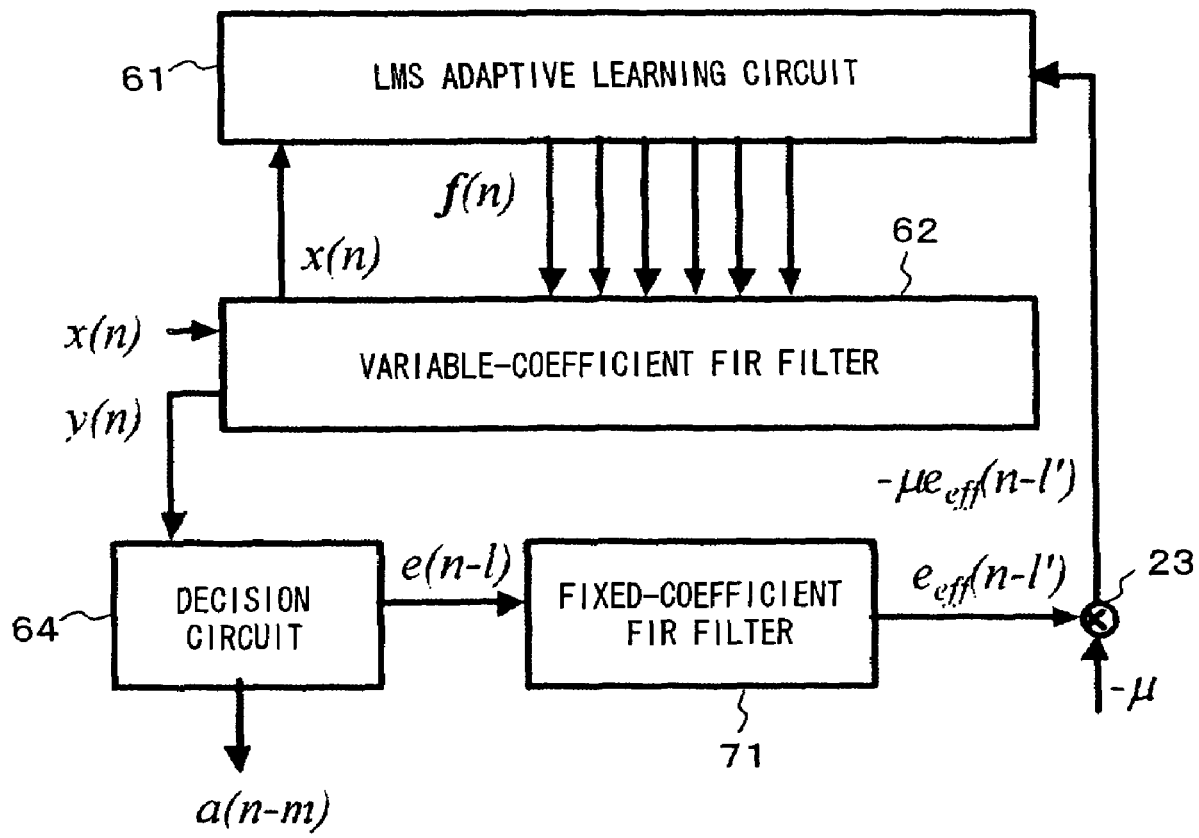
FIG. 4 shows the configuration of a third linear equalizer.

FIG. 4 shows the configuration of a linear equalizer that generates such an effective error signal. The linear equalizer shown in FIG. 4 is configured by removing the FIR filter 63 from the configuration shown in FIG. 2 and by using an FIR filter 71 instead of the FIR filter 65. A decision circuit 64 conducts decision after applying a linear operation to the output of an FIR filter 62. The filter coefficient of the FIR filter 71 is the self correlation function of an output signal series for an error pattern series.

However, since an error pattern and a signal series are not independent of each other, it is preferable to conduct feedback for coefficient learning only when the bit pattern of a signal series after decision causes the prescribed error pattern. For that purpose, feedback is conducted only at a clock time m where such an error pattern may occur.

It is simplest and most effective to use a pattern that is most open to an error, that is, a pattern that minimizes the first term of equation (11), as an error pattern. Thus, in the preferred embodiment, a pattern that depends on an input signal or an ideal output signal and that is most open to an error, such as a single bit (single pulse) error or a (1, −1, 1) error, is used as an error pattern.

Instead of the expected squared error difference value for a single bit error pattern, the weighted average of expected squared error difference values for a plurality of error patterns can also be used as an evaluation function for optimizing coefficients in an adaptive learning algorithm. Thus, the number of decision errors for the plurality of error patterns can be reduced.

Alternatively, as in the linear equalizer shown in FIG. 3B, the slope of an expected squared error value against a filter coefficient can be estimated using an effective input signal instead of a usual input signal, the slope can be multiplied by an appropriate coefficient and the obtained result can be fed back. In this case, if an effective input signal is generated by multiplying the usual input signal by the characteristic of an error pattern correlation function, filter coefficients that maximize the increase of an expected timewise sum of squared errors for an prescribed error pattern, can be obtained, as in a usual LMS algorithm.

FIG. 5 shows the configuration of a linear equalizer that generates such an effective input signal. The linear equalizer shown in FIG. 5 is configured by removing the FIR filter 63 from the configuration shown in FIG. 3B and by using an FIR filter 72 instead of the FIR filter 66.

In this case, for the characteristic of the FIR filter 72, a transfer characteristic corresponding to a linear operation needed to obtain the target signal of an operation to minimize an expected squared error value in the decision circuit 64 or its approximate characteristic is used.

Alternatively, such a linear equalizer is configured in multiple-stages by inserting a time-invariant linear filter after the FIR filter 62 shown in FIG. 4. In this case, another linear filter having an impulse response corresponding to the self correlation function of the output error signal of the linear filter in the case that the decision circuit 64 makes a decision error for a specific pattern, is inserted before or after the FIR filter 71. Thus, the error resistance of the decision circuit against the specific error pattern can be improved.

Furthermore, by conducting coefficient learning using an effective input signal instead of a usual input signal, as in the linear equalizer shown in FIG. 5, a squared error of a result obtained by applying the FIR filter 63 and a self-correlation characteristic of an error pattern to the output of FIR filter 62, can also be minimized.

Figure 6:
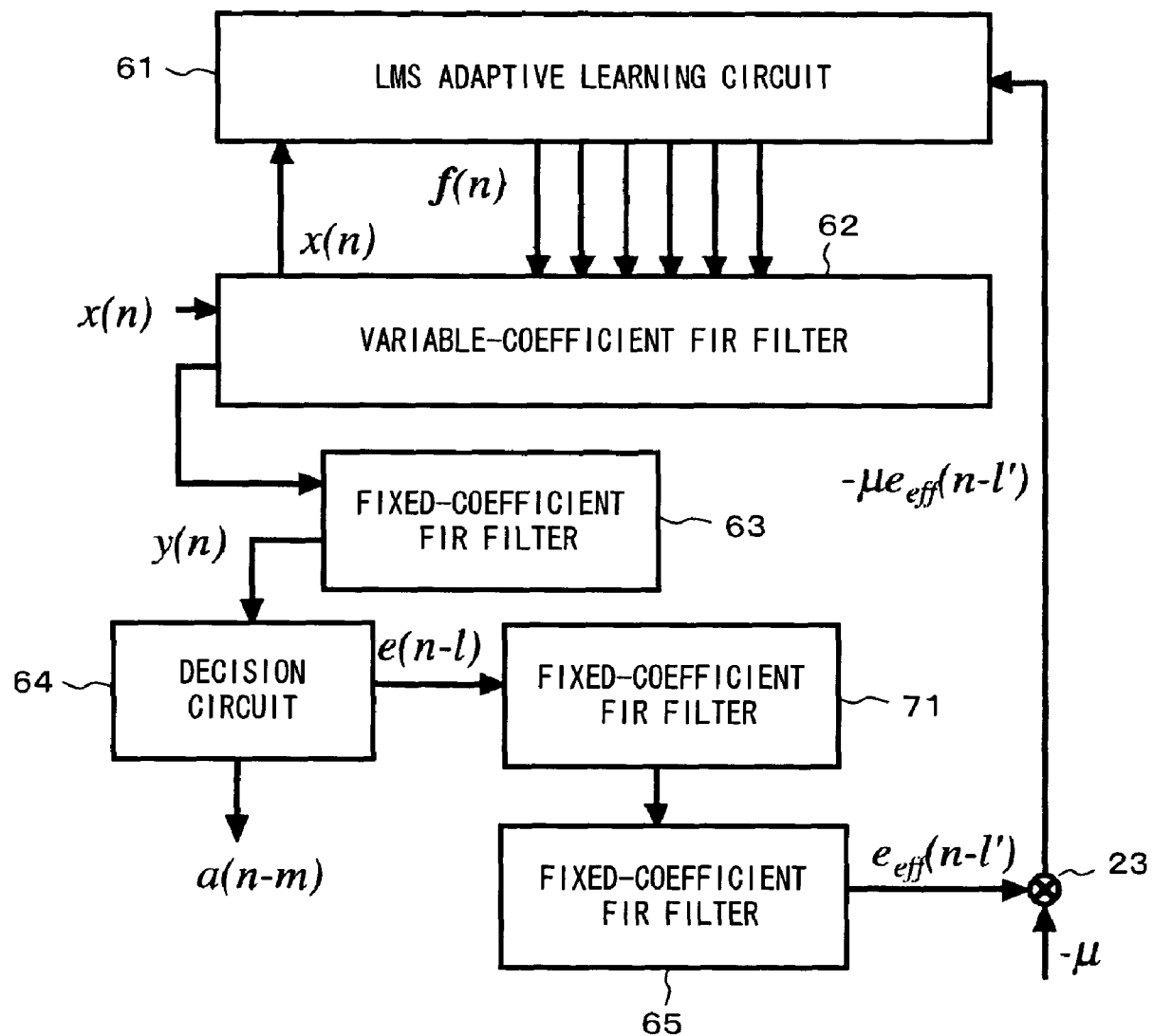
FIG. 6 shows the configuration of a fifth linear equalizer.

This linear equalizer is configured by removing the FIR filters 71 and 65 from the configuration shown in FIG. 6 and by inserting one or two linear filters between the learning circuit 61 and the FIR filter 62. Bypassing the input signal of the FIR filter 62 through the inserted linear filters and affecting the input signal by the characteristic of the FIR filter 63 and the self-correlation characteristic of the error pattern, and correlating the input signal to the error signal of the FIR filter 62 generated by the decision circuit 64, a signal for coefficient learning can be obtained.

Next, the configuration of a linear equalizer adopting a signal interpolation type timing recovery method and its adaptive learning algorithm are described with reference to FIGS. 7 and 8.

In the signal interpolation type timing recovery method, a signal at a preferred time can be obtained by sampling signals at time intervals Ts different from the original symbol interval T and interpolating the data. Thus, the effective sampling timing of signals can be adjusted. Usually, interpolation is conducted after equalization in order to prevent the delay time of an equalization filter from affecting a timing recovery loop. Therefore, an interpolation filter (interpolator), which is a time-variant linear filter, is provided after the equalization filter. Here, the case where a fixed-coefficient filter is further provided after it, is analyzed.

It is assumed here that the output $z(lT_s)$ of a variable-coefficient filter (adaptive filter), the output $w(mT)$ of an interpolation filter, the output $y(mT)$ of a post fixed-coefficient filter and a squared error mse are expressed as follows:

$$z(lT_s) = \sum_{i=N_{eq11}}^{N_{eq12}} f_{eq1}(i)x((l-i)T_s) \quad (15)$$

$$w(mT) = \sum_{j=N_{lp1}}^{N_{lp2}} f_{ip}(\mu(m), j)z((l(m)-j)T_s) \quad (16)$$

$$= \sum_{j=N_{lp1}}^{N_{lp2}} f_{ip}(\mu(m), j) \sum_{i=N_{eq11}}^{N_{eq12}} f_{eq1}(i)x((l(m)-i-j)T_s)$$

$$y(mT) = \sum_{n=N_{eq21}}^{N_{eq22}} f_{eq2}(n)w((m-n)T) \quad (17)$$

$$= \sum_{n=N_{eq21}}^{N_{eq22}} f_{eq2}(n) \sum_{j=N_{lp1}}^{N_{lp2}} f_{ip}(\mu(m-n), j) \sum_{i=N_{eq11}}^{N_{eq12}} f_{eq1}(i)x((l(m-n)-i-j)T_s)$$

$$mse = \langle (e(mT))^2 \rangle = \langle (y(mT) - \hat{y}(mT))^2 \rangle \quad (18)$$

FIG. 6 shows the configuration of such a linear equalizer. The linear equalizer shown in FIG. 6 is configured by inserting FIR filters 63 and 65 after the FIR filters 62 and 71 shown in FIG. 4, respectively. Alternatively, the same operation can also be realized by using a linear filter having a transfer characteristic that is expressed by the product of the respective transfer characteristics of the FIR filters 71 and 65 instead of serially connecting them.

In equation (18), y(mT) hat and e(mT) indicate the ideal output signal of the post fixed-coefficient filter and an error signal, respectively. In this case, the dependence of a squared error on the coefficient of an adaptive filter can be obtained as follows:

$$\frac{1}{2}\frac{\partial}{\partial f_{eq1}(i)}mse = \left\langle e(mT)\frac{\partial}{\partial f_{eq1}(i)}y(mT)\right\rangle = \quad (19)$$

$$\left\langle e(mT)\sum_{n=N_{eq21}}^{N_{eq22}} f_{eq2}(n)\right.$$

$$\left.\sum_{j=N_{lp1}}^{N_{lp2}} f_{ip}(\mu(m-n),\,j)x((1(m-n)-i-j)T_s)\right\rangle =$$

$$\left\langle x((1(m)-i-j)T_s)\sum_{j=N_{lp1}}^{N_{lp2}} f_{ip}(\mu(m),\,j)\sum_{n=N_{eq21}}^{N_{eq22}} f_{eq2}(n)e((m+n)T)\right\rangle =$$

$$\left\langle x((1-i-j)T_s)\sum_{j=N_{lp1}}^{N_{lp2}} f_{ip}(\mu(1),\,j)\sum_{n=N_{eq21}}^{N_{eq22}} f_{eq2}(n)e((m(1)+n)T)\right\rangle =$$

$$\left\langle x((1-i)T_s)\sum_{j=N_{lp1}}^{N_{lp2}} f_{ip}(\mu(1+j),\,j)\right.$$

$$\left.\sum_{n=N_{eq21}}^{N_{eq22}} f_{eq2}(n)e((m(1+j)+n)T)\right\rangle =$$

$$\langle x((1-i)T_s)e_I(1T_s)\rangle$$

$$e_I(1T_s) = \sum_{j=N_{lp1}}^{N_{lp2}} f_{ip}(\mu(1+j),\,j)\sum_{n=N_{eq21}}^{N_{eq22}} f_{eq2}(n)e((m(1+j)+n)T) \quad (20)$$

$e_f(1T_s)$ in equation (19) corresponds to an effective error signal expressed by equation (20). However, thinning-out is needed in the addition in a sampling cycle. Specifically, addition is not conducted for j where μ(l+j) is not defined, in the calculation of $e_f(1T_s)$. Therefore, if the slope of the expected squared error value against a filter coefficient is estimated using $e_f(1T_s)$ instead of e(mT), the slope is multiplied by an appropriate coefficient and the obtained result is fed back, filter coefficients that minimize the expected squared error value can be obtained.

It is known from equation (20) that an effective error signal $e_f(1T_s)$ can be obtained by firstly passing an error signal e(mT) through an FIR filter, whose coefficients can be obtained by timewise inverting the filter coefficients of a post fixed-coefficient filter, and then through a timewise-inverted interpolator inverse interpolation filter (inverse interpolator). However, in a real filter, the law of causality must be met. Therefore, in order to synchronize the effective error signal with an input signal, delay must be added to the input signal. If the output of the interpolation filter is thinned out, an error signal must be handled as 0.

Thus, even if an interpolator is used, an error signal can be handled in a similar way to the case where interpolation is not conducted, except that filter coefficients are time-variant.

If there is no post fixed-coefficient filter, the expected squared error value of the output of an interpolation filter can be minimized by passing the error signal of the output of the interpolation filter through a time-variant linear filter having timewise-inverted coefficients.

Figure 7:
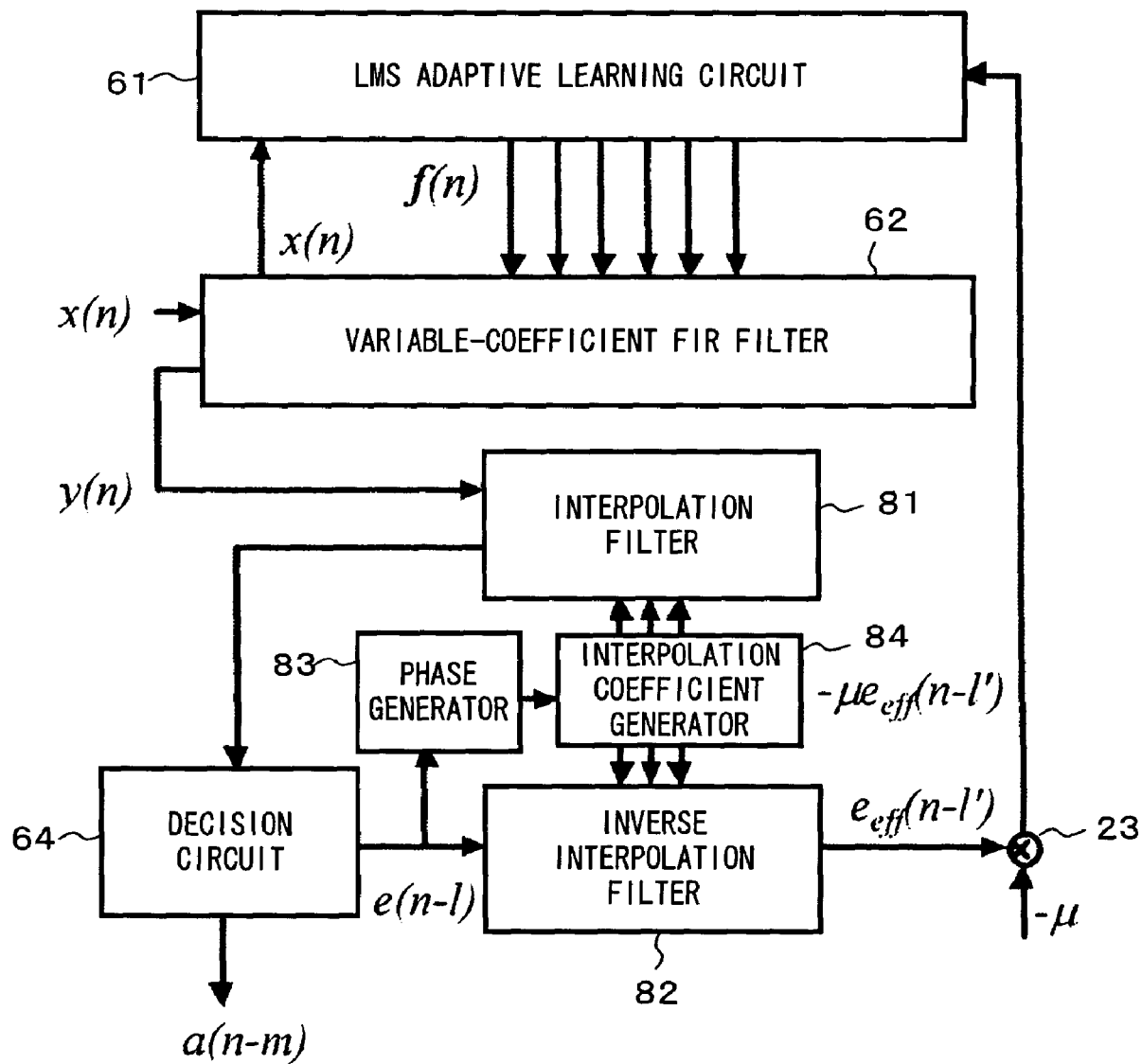
FIG. 7 shows the configuration of a sixth linear equalizer.

FIG. 7 shows the configuration of a linear equalizer that generates such an effective error signal. The linear equalizer shown in FIG. 7 comprises an LMS adaptive learning circuit 61, a fixed-coefficient FIR filter 62, a decision circuit 64, a multiplier 23, an interpolation filter 81, an inverse interpolation filter 82, a phase generator 83 and an interpolation coefficient generator 84.

Figure 1D:
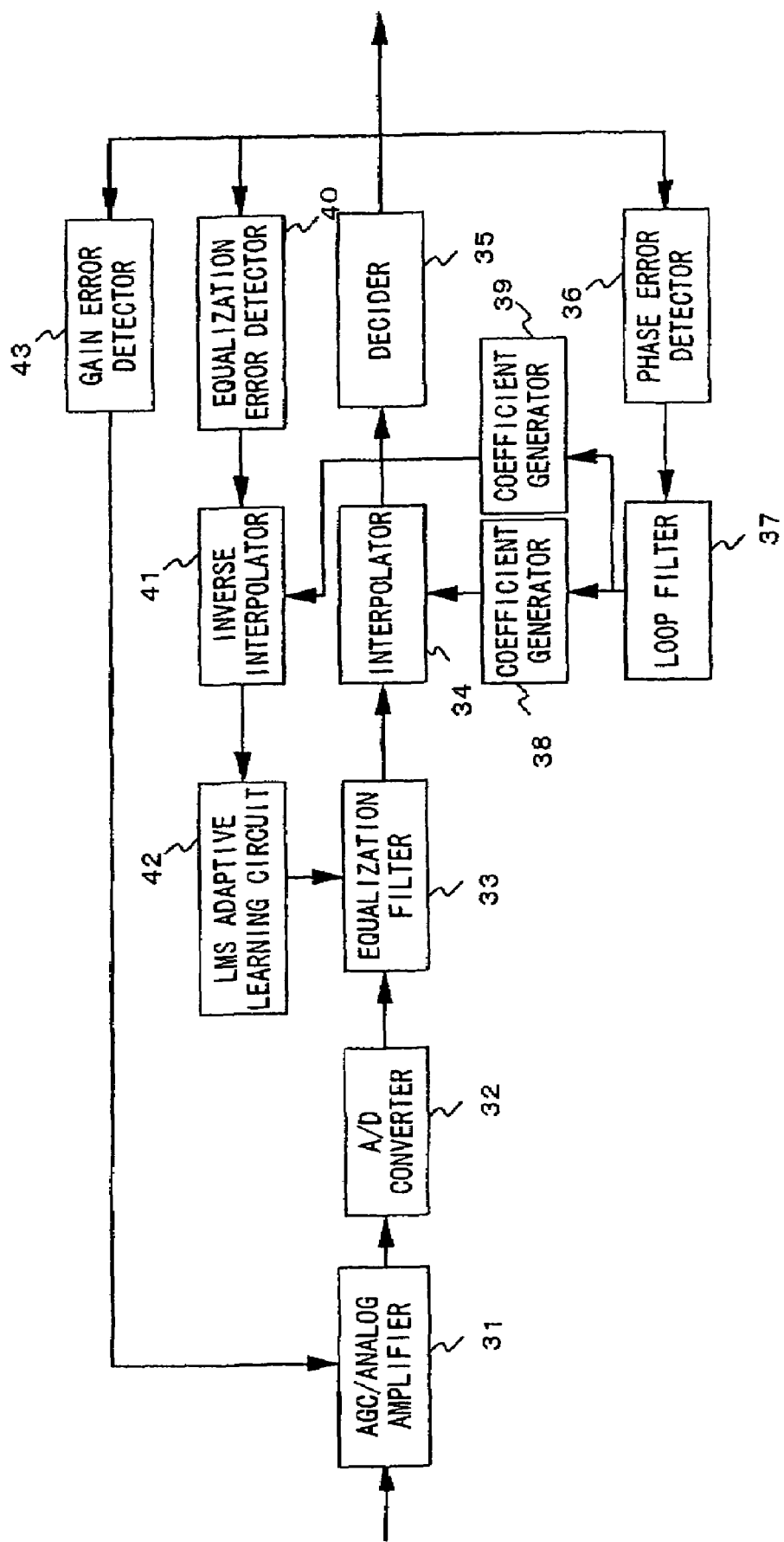

The interpolation filter 81 and the inverse interpolation filter 82 correspond to the interpolator 34 and inverse interpolator 41, respectively, which are shown in FIG. 1D. The phase generator 83 corresponds to the phase error detector 36 and loop filter 37, which are shown in FIG. 1D. The interpolation coefficient generator 84 corresponds to the coefficient generators 38 and 39, and generates the filter coefficients of the interpolation filter 81 and inverse interpolation filter 82. The interpolation coefficient generator 84 outputs filter coefficients obtained by reversely arraying interpolation coefficients corresponding to the outputs of the interpolation filter 81 or their approximate values as the coefficients of the inverse interpolation filter 82.

Figure 8:
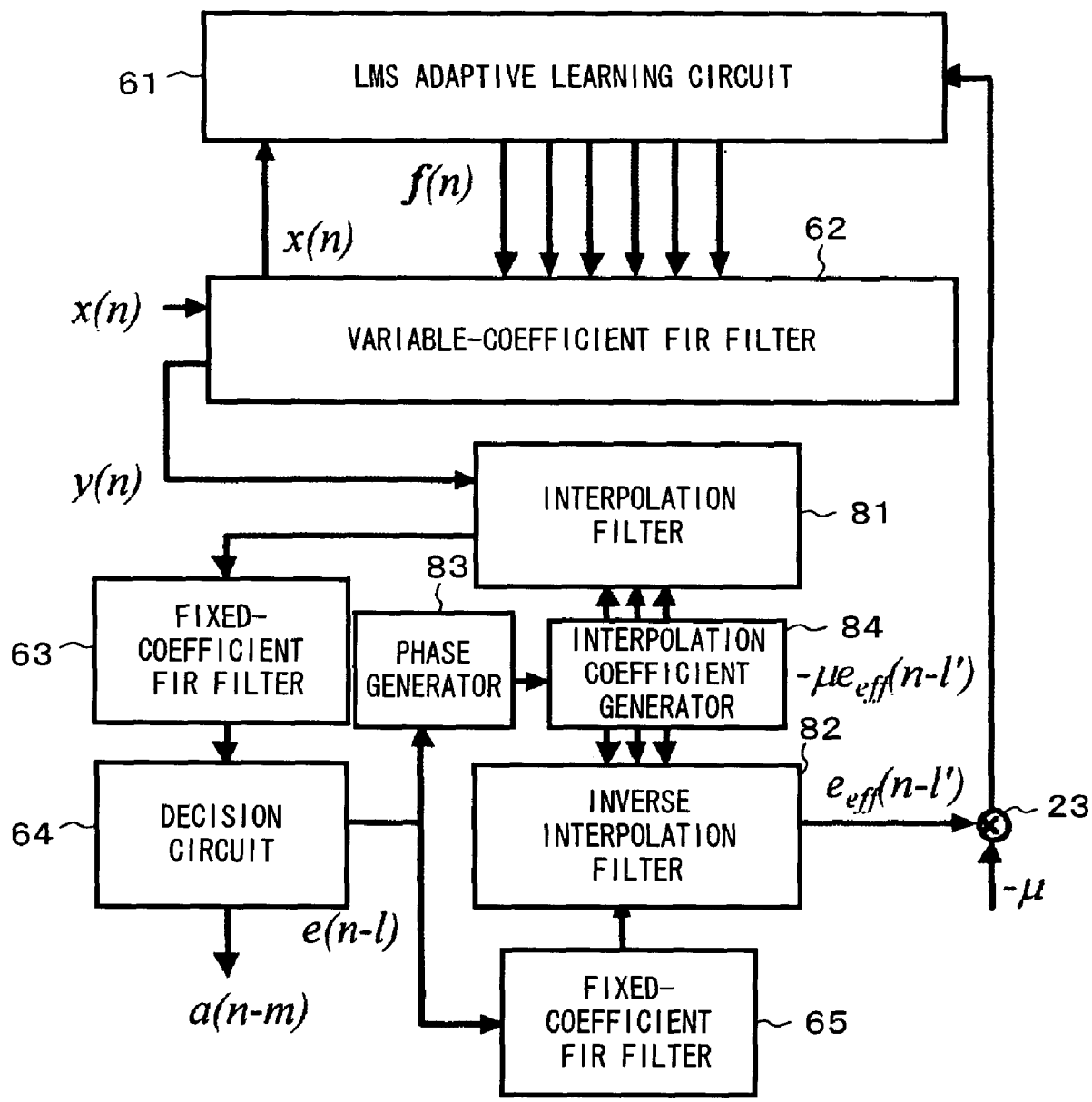
FIG. 8 shows the configuration of a seventh linear equalizer.

FIG. 8 shows the configuration of a linear equalizer with a post fixed-coefficient filter. The linear equalizer shown in FIG. 8 is configured by inserting a fixed-coefficient FIR filter 63 between the interpolation filter 81 and the decision circuit 64, and a fixed-coefficient FIR filter 65 between the decision circuit 64 and the inverse interpolation filter 82 in the configuration shown in FIG. 7. The FIR filter 65 has coefficients obtained by timewise inverting the filter coefficients of the FIR filter 63.

In such a case, an squared error of a result obtained by sequentially applying a plurality of linear operations to the output of a variable-coefficient equalization filter can be minimized by reversely passing the error signal through a plurality of linear filters having timewise-inverted coefficients when feeding back the error signal.

Although the configurations shown in FIGS. 7 and 8 are theoretically passable, in real application, it is preferable to further simplify the generation of an effective error signal. This is because it is meaningless to improve its accuracy more than required since it is the estimated value of a slope vector that is obtained by feeding back the error signal.

As the simplification method, there is, for example, a method using only filter coefficients of an interpolation filter (interpolation coefficients) of a large absolute value as the coefficients of an inverse interpolation filter, instead of all the interpolation coefficients and replacing interpolation coefficients of a small absolute value with 0. The generation of an effective error signal can be most simplified by using only top two interpolation coefficients of the largest and second-largest absolute values. Thus, the circuit configuration can be simplified and accordingly hardware costs can be reduced.

Furthermore, the change of the top two interpolation coefficients can also be linearly approximated. This method becomes very close to the conventional inverse interpolation using a straight line. However, in the method of the present invention, an error signal is handled as 0 if the output of an interpolation filter is thinned out, while in the straight-line inverse interpolation method, an extra error signal must be generated.

The dependence of a squared error on the coefficient of an adaptive filter can be expressed as follows by using an effective input signal $x_{eff}(1(m)T_s)$.

$$\frac{1}{2}\frac{\partial}{\partial f_{eq1}(i)}mse = \langle e(mT)x_{eff}((1(m)-i)T_s)\rangle \quad (21)$$

-continued $$x_{\mathit{eff}}(1(m)T_s) = \sum_{n=N_{eq21}}^{N_{eq22}} f_{eq2}(n) \sum_{j=N_{lp1}}^{N_{lp2}} f_{ip}(\mu(m-n), j) \times ((1(m-n)-j)T_s) \quad (22)$$

Therefore, if the same coefficient learning as in an LMS algorithm is conducted using a result obtained by passing an input signal through an interpolation filter and a post fixed-coefficient filter as an effective input signal, filter coefficients that minimize an expected squared error value of the output can be obtained. In this case, thinning-out is realized in the interpolation filter, and the same simplification as described above can also be realized.

If in the configuration shown in FIG. 7, the decision circuit 64 conducts a decision using a Viterbi decoder or a MAP decider. There is no problem if a fixed-coefficient FIR filter is inserted between the decision circuit 64 and the inverse interpolation filter 82 as in the configuration shown in FIG. 8. In this case, filter coefficients that minimize a squared error of the output or the error rate of the decider can be obtained by passing an output error signal from the decision circuit 64 through the inverse interpolation filter 82 after passing it through the FIR filter and feeding it back to the learning circuit 61.

Next, several specific examples of the linear equalizers mentioned above are described.

First, the case where a linear equalizer obtains filter coefficients that minimize a squared error of the output using an MEEPR characteristic $(1-D^2)(1+aD+bD^2)$ and a PR4 characteristic $(1-D^2)$ as an equalization target (input of a decision circuit) and an equalization characteristic for detecting a phase error for timing recovery, respectively, is studied.

In this case, since the linear equalizer has the configuration shown in FIG. 3A, a phase error can be detected from the output of the FIR filter 62 using $(1-D^2)$ and $(1+aD+bD^2)$ as the characteristics of the FIR filters 62 and 63, respectively. The characteristic $(b+aD+D^2)$ of the FIR filter 65 that feeds back the output can be obtained by inverting the coefficients of the FIR filter 63. However, since the delay difference between $(1+aD^{-1}+bD^{-2})$ and $(b+aD+D^2)$ is $D^2$, $l'-l=2$. In this case, a delay of two stages must be added to a tap input signal in addition to the respective delays of the FIR filter 63 and the decision circuit 64.

In a multi-stage linear equalizer as shown in FIGS. 3A, 7 and 8 or a linear equalizer that conducts the maximum likelihood decision or MAP decision as shown in FIG. 4, an output signal having a characteristic different from that of the natural equalization output, whose error is optimized, can also be obtained by using the output of an adaptive filter without passing it through any filter or a signal obtained by passing it through a linear filter. In this case, a phase error signal for timing recovery can be fed back in a relatively short delay time by using one output and the other output as a natural equalization output for decision and an equalization output for timing recovery, respectively.

For example, the case where a linear equalizer uses an MEEPR characteristic $(1-D)(1+aD+bD^2+cD^3)$, unlike in the above case, and a PR4 characteristic $(1-D^2)$ as an equalization target and an equalization characteristic for timing recovery, respectively, is studied. In this case, since an MEEPR characteristic cannot be expressed by the product of a PR4 characteristic and a fixed-coefficient filter characteristic, an MEEPR characteristic and a PR4 characteristic must be obtained by fixed-coefficient filters having characteristics $(1+aD+bD^2+cD^3)$ and $(1+D)$, respectively after obtaining a PR1 characteristic $(1-D)$ by an adaptive filter.

FIG. 9 shows the configuration of such a linear equalizer. The linear equalizer shown in FIG. 9 is obtained by providing one more fixed-coefficient FIR filter 91 after the FIR filter 62 and connecting its output to the decision circuit 92 in the configuration shown in FIG. 2. The decision circuit 92 detects a phase error and outputs a signal for timing recovery. The FIR filters 62 and 63 have characteristics $(1-D)$ and $(1+aD+bD^2+cD^3)$, respectively. The FIR filter 91 has a characteristic $(1+D)$. The characteristic $(c+bD+aD^2+D^3)$ of the FIR filter 65 that feeds back an output can be obtained by inverting the coefficients of the FIR filter 63. However, since the delay difference $(1+aD^{-1}+bD^{-2}+cD^{-3})$ and $(c+bD+aD^2+D^3)$ is $D^3$, $l'-l=3$. In this case, a delay of three stages must be added to a tap input signal.

Next, the case where a linear equalizer operates in such a way as to maximize the increase (Δmse) of path metric for a single pulse decision error (single decision error) is studied.

In this case, since the linear equalizer has the configuration shown in FIG. 4, the FIR filter 62 has a characteristic $(1-D^2)$ and a decision circuit performs a linear operation $(1+aD+bD^2)$. Since a single pulse response to a single decision error is $(1-D^2)(1+aD+bD^2)$ and its self correlation function is $(1-D^2)(1+aD+bD^2)(1-D^{-2})(1+aD^{-1}+bD^{-2})$, the characteristic of the FIR filter 71 for feedback becomes $(1-D^2)(1+aD+bD^2)(-1+D^2)(b+aD+D^2)$. However, since the delay difference between the self correlation function and the characteristic of the FIR filter 71 is $D^4$, $l'-l=4$. In this case, a delay of four stages must be added to a tap input signal.

Next, the case where the increase of path metric for a decision error pattern $(1, -1, 1)$ is maximized is studied.

In this case, since a single pulse response to an error pattern is $(1-D^2)(1+aD+bD^2)(1-D+D^2)$ and its self correlation function is $(1-D^2)(1+aD+bD^2)(1-D+D^2)(1-D^{-2})(1+aD^{-1}+bD^{-2})(1-D^{-1}+D^{-2})$, the characteristic of the FIR filter 71 becomes $(1-D^2)(1+aD+bD^2)(-1+D^2)(b+aD+D^2)(1-D+D^2)^2$. Thus, in this case, a delay of six stages must be added to a tap input signal in relation to the delay difference between the self correlation function and the characteristic of the FIR filter.

It is only when a signal series is $(0, 1, 0)$ or $(1, 0, 1)$ that a decision error pattern $(1, -1, 1)$ occurs. Therefore, by replacing an error signal with 0 in other cases, an extra feedback can also be prevented from occurring.

Figure 10:
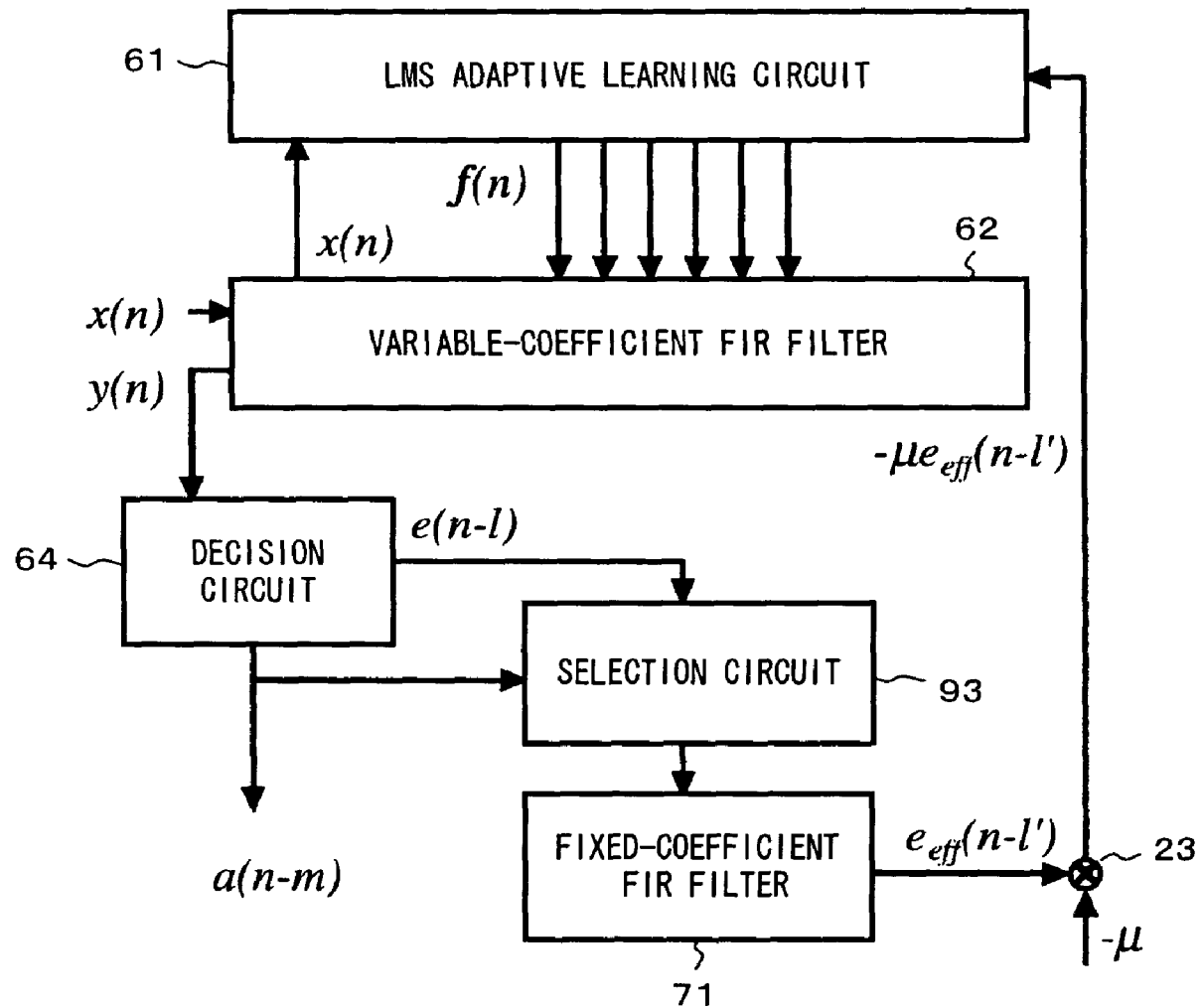
FIG. 10 shows the configuration of a ninth linear equalizer.

FIG. 10 shows the configuration of such a linear equalizer. The linear equalizer shown in FIG. 10 is configured by inserting a selection circuit 93 between the decision circuit 64 and the FIR filter 71 in the configuration shown in FIG. 10. The selection circuit 93 operates by using a decision signal a(n-m) as a control input. If the decision signal corresponds to a signal series $(0, 1, 0)$ or $(1, 0, 1)$, the selection circuit 93 selects an error signal e(n-1). Otherwise, the selection circuit 93 outputs a signal of a fixed value 0.

Next, the case where the squared error of the output of a linear equalizer adopting a signal interpolation type timing recovery method is minimized, is studied. This linear equalizer has the configuration shown in FIG. 7. In this case, as the filter coefficients of an inverse interpolation filter 82 for feedback, the time-variant filter coefficients of the interpolation filter 81 can be used by reversely arraying them. The configuration of the inverse interpolation 82 can also be simplified by replacing a coefficient of a small absolute value with 0 or using the approximate value of the coefficient. In the case of over-sampling, there is a clock time at which the output of an interpolation filter 81 is thinned out. However, extra feedback can be prevented from occurring by replacing the error signal with 0 at this clock time.

The configuration of an inverse interpolation filter 82 can also be simplified by using only the top two filter coefficients of the largest and second-largest absolute value of the interpolation filter 81 and using two coefficients obtained by reversely arraying them as the filter coefficients of the inverse interpolation filter 82.

Furthermore, coefficients obtained by linearly approximating the top two coefficients with respect to the interpolation phase can also be used for that purpose. Taking an example of this case, an inverse interpolation method is described below with reference to FIGS. 11 through 13.

Figure 11:
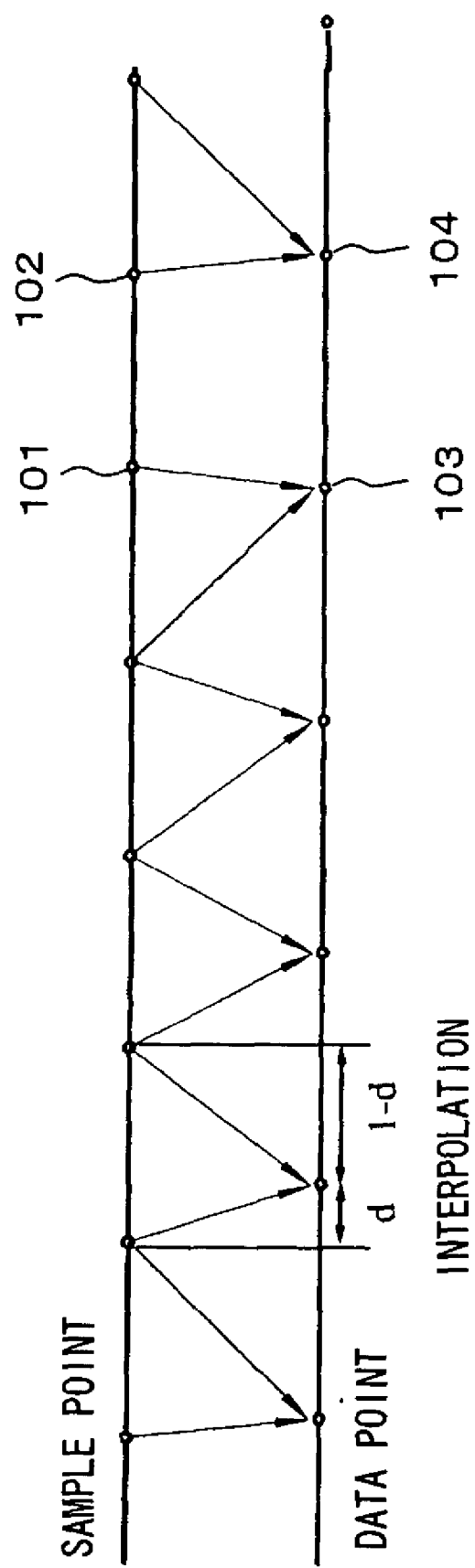
FIG. 11 shows the interpolation of a data signal.

FIG. 11 shows an example of the interpolation of a data signal. In this example, an example of linear interpolation using the values at two points (sample values) before and after a data point is shown for convenience sake. d indicates the position of a data point between two sampling times and is called an interpolation phase. In the case of linear interpolation, an interpolation value y0 that is generated from two sample values x0 and x1 can be calculated as follows using interpolation phase d and (1−d) as interpolation coefficients.

$$y0=(1-d)x0+dx1 \quad (23)$$

Therefore, in linear approximation, the filter coefficients of the inverse interpolation filter 82 can be generated using d and (1−d) as the approximate values of the interpolation coefficients. In FIG. 11, it is found that a data point is not generated using two sample points 101 and 102 and the data points (interpolation output) are thinned out.

In the case of four-point interpolation, y0 can be calculated as follows using four sample values, $x_i$ (i=−1, 0, 1, 2) and an interpolation coefficient $c_i$ that is determined by interpolation phase d.

$$y0=c_{-1}(d)x_{-1}+c_0(d)x_0+c_1(d)x_1+c_2(d)x_2 \quad (24)$$

Figure 12:
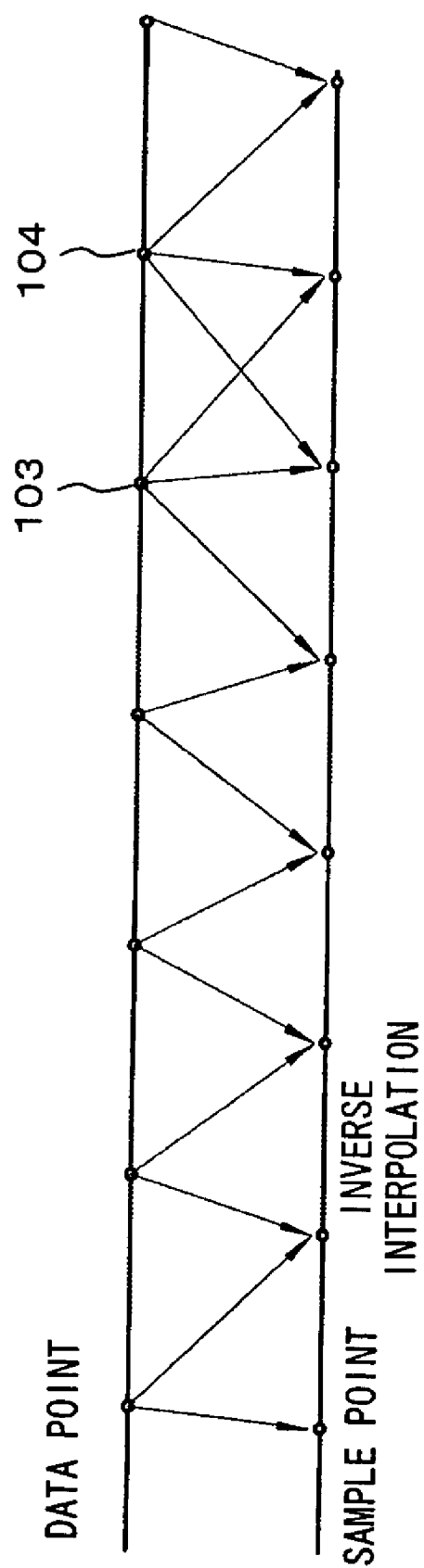
FIG. 12 shows the first inverse interpolation of an error signal.

FIG. 12 shows the conventional inverse interpolation of an error signal. In this case, although interpolation calculates an error at a sample point from an error value at a data point, basically interpolation and inverse interpolation are different operations. Therefore, inverse interpolation coefficients must be determined separately from interpolation coefficients. Therefore, even if higher-order interpolation is applied to data, low-accuracy linear interpolation or zero-th order hold is applied to the inverse interpolation of an error signal. Even if data points are thinned out, an error signal is fed back. Therefore, in that case, inverse interpolation using two data points 103 and 104 is applied twice.

Figure 13:
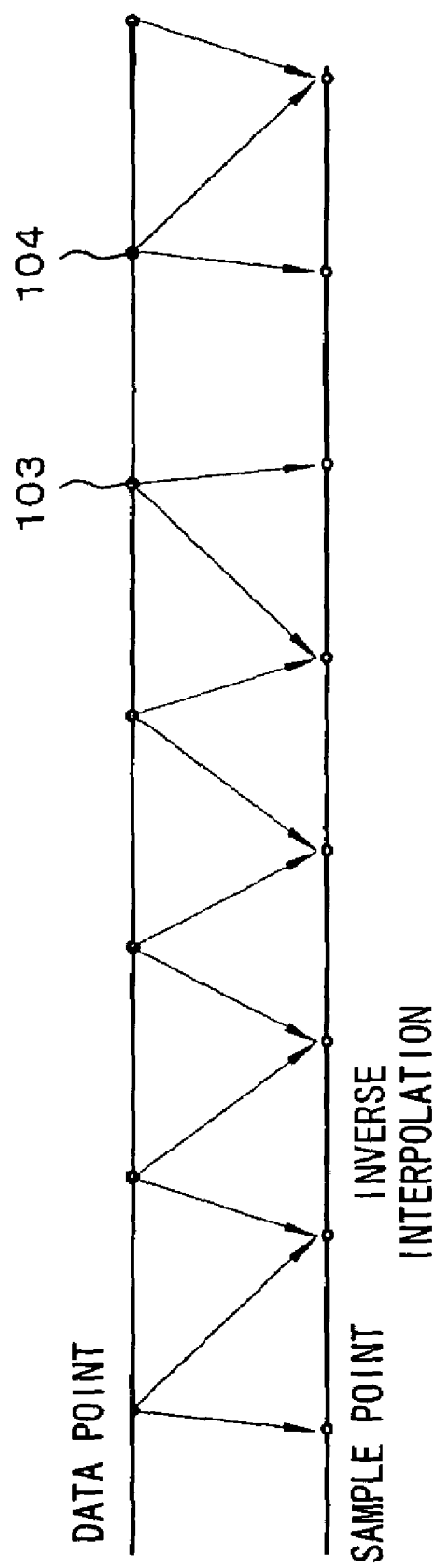
FIG. 13 shows the second inverse interpolation of an error signal.

However, in the reverse interpolation according to the present invention, since the reverse operation to the interpolation is conducted, the interpolation coefficients can also be used for inverse interpolation without generating reverse interpolation coefficients. Accordingly, another coefficient generator generating inverse interpolation coefficients is not needed. If in interpolation, an error signal at a clock time at which thinning-out is conducted is replaced with 0, as shown in FIG. 13, no feedback of an extra error signal is needed even in inverse interpolation. Thus, there is a difference in the feedback method of an error signal when interpolation outputs are thinned out, between the conventional method and the method according to the present invention.

In the preferred embodiments described above, a characteristic equivalent to the remaining part obtained by eliminating the transfer characteristic of an adaptive filter from the transfer characteristic of a route between an input signal of the adaptive filter and an equalization target (the target signal of an operation to minimize an expected squared error value) or its approximate characteristic is applied to an input signal. Alternatively, the characteristic or its approximate characteristic is applied to an output error signal by using timewise-inversion. However, a signal for coefficient learning can also be obtained by applying a part of this characteristic to the input signal and the rest of the characteristic to the output error signal using timewise-inversion.

FIG. 14 shows the configuration of such a linear equalizer. The linear equalizer shown in FIG. 14 is configured by replacing the FIR filter 65 in the configuration shown in FIG. 2 with a fixed-coefficient FIR filter 112 and inserting a fixed-coefficient FIR filter 111 between the learning circuit 61 and the FIR filter 62. In this case, the characteristic of the FIR filter 63 corresponds to the rest of the transfer characteristic. If this characteristic is expressed by the product of two transfer characteristics A and B, A can be used as the characteristic of the FIR filter 111 and a characteristic obtained by timewise inverting B can be used as the characteristic of the FIR filter 112.

In a computer simulation using the linear equalizer model of the preferred embodiment described above, if it is assumed that the statistical property of an input signal is uniform and the tap coefficients obtained when the input signal is inputted to a linear equalizer is calculated in advance, such values can also be fixedly used. For example, if a variable-coefficient FIR filter 62 is replaced with a fixed-coefficient FIR filter having the tap coefficients obtained by such a simulation, coefficient learning using an error signal is not needed and accordingly, the configuration of a linear equalizer can be simplified.

Further, the linear equalizer according to the present invention can also be used for adaptive equalization in various devices other than a read channel circuit of a disk device.

According to the present invention, by feeding back an error signal through a time-variant or time-invariant linear filter in the coefficient learning of an adaptive filter and by correlating the error signal to a tap input signal instead of feeding it back as in an LMS algorithm, optimal filter coefficients such that cannot be obtained by a simple LMS algorithm can be obtained.

The same effect can also be obtained by a method of correlating a signal obtained by passing an input signal through a time-variant or time-invariant linear filter to an error signal. Furthermore, such an effect can also be obtained by combining the two methods.

Although the present invention is particularly effective when the maximum likelihood decider or a MAP decider, which are indispensable technologies in the current read channel circuit, conducts such a signal decision, its application targets are widely spread including the case where a linear filter or an interpolator is provided after an adaptive filter. In the present invention, since these application targets are uniformly handled, it can be easily applied also to a combination of the targets.

What is claimed is:

1. A digital filter, comprising:
   an adaptive filter having adaptively variable coefficients;
   a time-invariant linear filter generating an error signal for feedback from an error signal generated using an output of the adaptive filter; and
   a learning circuit adaptively learning the coefficients of the adaptive filter using an error signal fed back from the time-invariant linear filter.

2. A digital filter, comprising:
   an adaptive filter having adaptively variable coefficients;

a first time-invariant linear filter to which an output signal of the adaptive filter is inputted;
a second time-invariant linear filter generating an error signal for feedback from an error signal of an output of the first linear filter; and
a learning circuit adaptively learning the coefficients of the adaptive filter using an error signal fed back from the second linear filter.

3. The digital filter according to claim 2, wherein said second linear filter has filter coefficients obtained by inverting an order of filter coefficients of the first linear filter.

4. The digital filter according to claim 2, further comprising a third linear filter generating a signal having a characteristic different from a characteristic of the first linear filter, from the output signal of said adaptive filter.

5. The digital filter according to claim 4, further comprising a decision circuit detecting a phase error using an output signal of said third linear filter and generating a signal for timing recovery.

6. A digital filter, comprising
an adaptive filter having adaptively variable coefficients;
a decision circuit performing a linear operation using an output signal of the adaptive filter and generating an error signal of an obtained signal;
a time-invariant linear filter generating an error signal for feedback from the error signal generated by the decision circuit; and
a learning circuit adaptively learning the coefficients of the adaptive filter using an error signal fed back from the linear filter.

7. A digital filter, comprising
an adaptive filter having adaptively variable coefficients;
a decision circuit estimating a signal series of an input signal from an output signal of the adaptive filter by one of a maximum likelihood decision and a maximum a posteriori probability decision and generating an error signal; and
a learning circuit learning the coefficients of the adaptive filter using an error signal fed back from the decision circuit in such a way that an expected difference between a sum of squares of an output error signal series for a correct signal series and a sum of squares of an output error signal series in a case of a decision error increases.

8. The digital filter according to claim 7, further comprising
a linear filter having an impulse response corresponding to a self correlation function of an output error signal of said adaptive filter generated when the said decision circuit makes a decision error of a specific pattern and generating an error signal for feedback from the error signal generated by said decision circuit, wherein
said learning circuit learns the coefficients of said adaptive filter using the error signal generated by the linear filter.

9. The digital filter according to claim 8, wherein the specific pattern is an error pattern in which an error is most easily committed and is determined by an input signal and an ideal output signal of said adaptive filter.

10. The digital filter according to claim 8, wherein the specific pattern is a single bit error pattern.

11. The digital filter according to claim 8, wherein the error signal is fed back to said learning circuit from the linear filter only if a signal series after a decision causes the specific pattern.

12. The digital filter according to claim 7, wherein said learning circuit learns the coefficients of said adaptive filter in such a way that a weighted average of the expected difference between the sums of squares of an error for a plurality of error patterns increases.

13. A digital filter, comprising:
an adaptive filter having adaptively variable coefficients;
a first linear filter to which an output signal of the adaptive filter is inputted;
a decision circuit estimating a signal series of an input signal from an output signal of the first linear filter by one of a maximum likelihood decision and a maximum a posteriori probability decision and generating an error signal;
a second linear filter having an impulse response corresponding to a self correlation function of an output error signal of the adaptive filter generated when the decision circuit makes a decision error of a specific pattern and to which the error signal generated by the decision circuit is inputted;
a third linear filter generating an error signal for feedback from an output signal of the second linear filter; and
a learning circuit learning the coefficients of the adaptive filter using an error signal fed back from the third linear filter in such a way that an expected difference between a sum of squares of an output error signal series for a correct signal series and a sum of squares of an output error signal series in a case of a decision error increases.

14. A digital filter, comprising:
an adaptive filter having adaptively variable coefficients;
a first linear filter to which an output signal of the adaptive filter is inputted;
a decision circuit estimating a signal series of an input signal from an output signal of the first linear filter by one of a maximum likelihood decision and a maximum a posteriori probability decision and generating an error signal;
a second linear filter to which the error signal generated by the decision circuit is inputted;
a third linear filter having an impulse response corresponding to a self correlation function of an output error signal of the adaptive filter generated when the decision circuit makes a decision error of a specific pattern and generating an error signal for feedback from an output signal of the second linear filter;
a learning circuit learning the coefficients of the adaptive filter using an error signal fed back from the third linear filter in such a way that an expected difference between a sum of squares of an output error signal series for a correct signal series and a sum of squares of an output error signal series in a case of a decision error increases.

15. A digital filter, comprising:
an adaptive filter having adaptively variable coefficients;
a first linear filter to which an output signal of the adaptive filter is inputted;
a decision circuit estimating a signal series of an input signal from an output signal of the first linear filter by one of a maximum likelihood decision and a maximum a posteriori probability decision and generating an error signal;
a second linear filter having a transfer characteristic expressed by a product of a filter characteristic obtained by inverting an order of filter coefficients of the first linear filter and an impulse response corresponding to a self correlation function of an output error signal of the adaptive filter generated when the decision circuit commits a decision error of a specific pattern, and generating an error signal for feedback from the error signal generated by the decision circuit;

a learning circuit learning the coefficients of the adaptive filter using an error signal fed back from the second linear filter in such a way that an expected difference between a sum of squares of an output error signal series for a correct signal series and a sum of squares of an output error signal series in a case of a decision error increases.

16. A digital filter, comprising
an adaptive filter having adaptively variable coefficients;
an interpolation filter interpolating an output signal of the adaptive filter and generating a signal in a prescribed timing;
an inverse interpolation filter having filter coefficients obtained by inverting an order of one of interpolation coefficients corresponding to an output of the interpolation filter and approximate values of the interpolation coefficients, and generating an error signal in timing before interpolation by inversely interpolating an error signal of the output of the interpolation filter; and
a learning circuit adaptively learning the coefficients of the adaptive filter using an error signal fed back from the inverse interpolation filter.

17. The digital filter according to claim 16, wherein
said inverse interpolation filter has filter coefficients obtained by inverting an order of a plurality of coefficients of a large absolute value of the interpolation coefficients.

18. The digital filter according to claim 16, wherein
said inverse interpolation filter has filter coefficients obtained by inverting an order of two coefficients of a large absolute value of the interpolation coefficients.

19. The digital filter according to claim 16, wherein
said inverse interpolation filter has filter coefficients obtained by inverting an order of coefficients obtained by linearly approximating two coefficients of a large absolute value of the interpolation coefficients with respect to interpolation phase.

20. A digital filter, comprising:
an adaptive filter having adaptively variable coefficients;
an interpolation filter interpolating an output signal of the adaptive filter and generating a signal in a prescribed timing;
a first linear filter to which an output signal of the interpolation filter is inputted;
a second linear filter to which an error signal of an output of the first linear filter is inputted;
an inverse interpolation filter having filter coefficients obtained by inverting an order of one of interpolation coefficients corresponding to an output of the interpolation filter and approximate values of the interpolation coefficients, and generating an error signal in timing before interpolation by inversely interpolating an output signal of the second linear filter; and
a learning circuit adaptively learning the coefficients of the adaptive filter using an error signal fed back from the inverse interpolation filter.

21. A digital filter, comprising:
an adaptive filter having adaptively variable coefficients;
an interpolation filter interpolating an output signal of the adaptive filter and generating a signal in a prescribed timing;
a decision circuit performing a linear operation using an output signal of the interpolation filter and generating an error signal of an obtained signal;
a linear filter to which the error signal generated by the decision circuit is inputted;
an inverse interpolation filter having filter coefficients obtained by inverting an order of one of interpolation coefficients corresponding to an output of the interpolation filter and approximate values of the interpolation coefficients, and generating an error signal in timing before interpolation by inversely interpolating an output signal of the linear filter; and
a learning circuit adaptively learning the coefficients of the adaptive filter using an error signal fed back from the inverse interpolation filter.

22. A digital filter, comprising:
an adaptive filter having adaptively variable coefficients;
a decision circuit generating an error signal of an output of the adaptive filter;
a linear filter generating an effective input signal for adaptive learning from an input signal of the adaptive filter; and
a learning circuit adaptively learning the coefficients of the adaptive filter by correlating the effective input signal from the linear filter to an error signal fed back from the decision circuit.

23. A digital filter, comprising:
an adaptive filter having adaptively variable coefficients;
a decision circuit performing a linear operation using an output signal of the adaptive filter and generating an error signal of an obtained signal;
a linear filter generating an effective input signal for adaptive learning from an input signal of the adaptive filter; and
a learning circuit adaptively learning the coefficients of the adaptive filter by correlating the effective input signal from the linear filter to an error signal fed back from the decision circuit.

24. The digital filter according to claim 23, wherein
said linear filter has one of a characteristic equivalent to a remaining part obtained by eliminating a transfer characteristic of the adaptive filter from a transfer characteristic of a route between the input signal of the adaptive filter and the signal obtained by the linear operation, and a characteristic obtained by approximating the remaining part.

25. A digital filter, comprising:
an adaptive filter having adaptively variable coefficients;
a first linear filter to which an output signal of the adaptive filter is inputted;
a decision circuit performing a linear operation using an output signal of the adaptive filter and generating an error signal of an obtained signal;
a second linear filter generating an effective input signal for adaptive learning from an input signal of the adaptive filter; and
a learning circuit adaptively learning the coefficients of the adaptive filter by correlating the effective input signal from the second linear filter to an error signal fed back from the decision circuit.

26. A digital filter, comprising:
an adaptive filter having adaptively variable coefficients;
a decision circuit performing a linear operation using an output signal of the adaptive filter and generating an error signal of an obtained signal;
a first linear filter generating an error signal for feedback from the error signal generated by the decision circuit;
a second linear filter generating an effective for input signal adaptive learning from an input signal of the adaptive filter; and a learning circuit adaptively learning the coefficients of the adaptive filter by correlating the effective input signal from the second linear filter to an error signal fed back from the first linear filter.

27. The digital filter according to claim 26, wherein
a product of a transfer characteristic of the first linear filter and a transfer characteristic of the second linear filter is expressed by one of a remaining characteristic obtained by eliminating a transfer characteristic of the adaptive filter from a transfer characteristic of a route between the input signal of the adaptive filter and the signal obtained by the linear operation, and a characteristic obtained by approximating the remaining part.

28. A digital filter, comprising:
a fixed-coefficient filter having filter coefficients determined by a simulation that provides a digital filter model, which learns coefficients of an adaptive filter having adaptively variable coefficients by feeding back an error signal generated using an output of the adaptive filter through a time-invariant linear filter, with an input signal of a specific statistical property and conducts coefficient learning; and
a learning circuit estimating a signal series of an input signal from an output signal of the fixed-coefficient filter.

29. A digital filter, comprising:
an adaptive filter means having adaptively variable coefficients;
a time-invariant linear filter means for generating an error signal for feedback from an error signal generated using an output of the adaptive filter means; and
a learning circuit means for adaptively learning the coefficients of the adaptive filter means using an error signal fed back from the time-invariant linear filter means.

30. A digital filter, comprising
an adaptive filter means having adaptively variable coefficients;
an interpolation filter means for interpolating an output signal of the adaptive filter means and generating a signal in a prescribed timing;
an inverse interpolation filter means having filter coefficients obtained by inverting an order of one of interpolation coefficients corresponding to an output of the interpolation filter means and approximate values of the interpolation coefficients, and generating an error signal in timing before interpolation by inversely interpolating an error signal of the output of the interpolation filter means; and
a learning circuit means for adaptively learning the coefficients of the adaptive filter means using an error signal fed back from the inverse interpolation filter means.

* * * * *

UNITED STATES PATENT AND TRADEMARK OFFICE
CERTIFICATE OF CORRECTION

PATENT NO. : 7,421,017 B2 Page 1 of 1
APPLICATION NO. : 10/639616
DATED : September 2, 2008
INVENTOR(S) : Takatsu It is certified that error appears in the above-identified patent and that said Letters Patent is hereby corrected as shown below:

In the Claims:

Col. 24, line 65, delete "for input signal" and insert --input signal for--.

Signed and Sealed this

Twenty-fourth Day of February, 2009

JOHN DOLL
*Acting Director of the United States Patent and Trademark Office*